(12) United States Patent
Parikh

(10) Patent No.: US 6,940,170 B2
(45) Date of Patent: *Sep. 6, 2005

(54) TECHNIQUES FOR TRIPLE AND QUADRUPLE DAMASCENE FABRICATION

(75) Inventor: Suketu A. Parikh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 474 days.

This patent is subject to a terminal disclaimer.

(21) Appl. No.: 09/843,419

(22) Filed: Apr. 26, 2001

(65) Prior Publication Data

US 2001/0041436 A1 Nov. 15, 2001

Related U.S. Application Data

(62) Division of application No. 09/165,233, filed on Oct. 1, 1998, now Pat. No. 6,225,207.

(51) Int. Cl.[7] .......................... H01L 29/00; H01L 21/44; H01L 23/485

(52) U.S. Cl. .................. 257/750; 257/751; 257/752; 257/758; 257/775; 438/600; 438/622; 438/637; 438/638; 438/700; 438/738; 438/740

(58) Field of Search .................... 257/520, 521, 257/522, 523, 750, 752, 758; 438/600, 622, 637, 638, 700, 738, 740

(56) References Cited

U.S. PATENT DOCUMENTS

| | | | |
|---|---|---|---|
| 5,354,711 A | 10/1994 | Heitzmann et al. | 437/182 |
| 5,539,255 A | 7/1996 | Cronin | 257/750 |
| 5,592,024 A | 1/1997 | Aoyama et al. | 257/751 |
| 5,614,765 A | 3/1997 | Avanzino et al. | 257/774 |
| 5,635,423 A | 6/1997 | Huang et al. | 437/195 |
| 5,651,855 A | 7/1997 | Dennison et al. | 156/636.1 |
| 5,663,101 A | 9/1997 | Cronin | 438/637 |
| 5,691,238 A | 11/1997 | Avanzino et al. | 437/195 |
| 5,705,430 A | 1/1998 | Avanzino et al. | 437/195 |
| 5,726,100 A | 3/1998 | Givens | 438/702 |
| 5,739,579 A | 4/1998 | Chiang et al. | 257/635 |
| 5,741,626 A | 4/1998 | Jain et al. | 430/314 |
| 5,759,911 A | 6/1998 | Cronin et al. | 438/622 |
| 5,886,411 A | 3/1999 | Kohyama | 257/774 |
| 5,897,369 A | 4/1999 | Jun | 438/629 |
| 6,001,733 A | 12/1999 | Huang et al. | 438/633 |
| 6,017,817 A | 1/2000 | Chung et al. | 438/637 |
| 6,051,881 A | 4/2000 | Klein et al. | 257/756 |
| 6,057,227 A | 5/2000 | Harvey | 438/626 |
| 6,103,619 A | 8/2000 | Lai | 438/638 |
| 6,107,204 A | 8/2000 | Yu et al. | 438/694 |
| 6,114,234 A | 9/2000 | Merchant et al. | 438/631 |
| 6,133,140 A | 10/2000 | Yu et al. | 438/624 |
| 6,133,144 A | 10/2000 | Tsai et al. | 438/634 |
| 6,143,646 A | 11/2000 | Wetzel | 438/637 |
| 6,225,207 B1 * | 5/2001 | Parikh | 438/622 |

FOREIGN PATENT DOCUMENTS

| | | | |
|---|---|---|---|
| EP | 0680085 A | 11/1995 | ......... H01L/21/768 |
| EP | 0851483 A | 7/1998 | ......... H01L/21/768 |
| EP | 0911697 A | 4/1999 | ............ G03F/1/00 |

OTHER PUBLICATIONS

Girard et al. "Same Level Integration Of Dual Thickness And Pitch Metal", paper presented at the Thin Film Users Group, California Chapter, 11 pages, Oct. 1997.

Kaanta et al., "Dual Damascene: A ULSI Wring Technology", VMIC Conference, IEEE, pp. 144–152, Jun. 11–12, 1991.

* cited by examiner

Primary Examiner—David Nelms
Assistant Examiner—Renee R. Berry
(74) Attorney, Agent, or Firm—Albert J. Dalhuisen

(57) ABSTRACT

The present invention provides integrated circuit fabrication methods and devices wherein triple damascene structures are formed in five consecutive dielectric layers (312, 314, 316, 318 and 320), using two etching sequences. A first etching sequence comprising: depositing a first etch mask layer (322), on the fifth (top) layer (320), developing a power line trench pattern (324) and a via pattern (326) in the first mask layer, simultaneously etching the power line trench pattern (324) and the via pattern (326) through the top three dielectric layers (316, 318, 320), and removing the first etch mask layer. A second etching sequence including: depositing a second etch mask layer (330), on the fifth layer (320) and inside the power line trench (325) formed in the first etching sequence, developing a signal line pattern (332) overlaying the via pattern (327) in the second etch layer, etching the via pattern (327) through the second layer (312), and subsequently etching the via pattern (327) through the first layer(312) while simultaneously etching the signal line trench pattern (332) through the fifth layer (320). The etching sequences result in the formation of a power line trench (325) and a signal line trench (336) with an underlying via hole (340). These trenches and the via hole are simultaneously filled with a conductive material, such as a metal, to form a triple damascene structure including a power line (352) and a signal line (354) having an underlying via plug (356). This triple damascene structure uses three design rules while only requiring two etch mask layers, and only one planarizing or etch back stop to define the interconnect lines. Similar novel techniques can be employed to fabricate a quadruple damascene structure including a power line (450) having an underlying via plug (452) and a signal line (454) with an underlying via plug (456), while using four design rules. The inventive techniques can also be utilized to form similar triple and quadruple damascene structures in a variety of dielectric stacks. In additional embodiments, manufacturing systems (1110) are provided for fabricating IC structures, such as the novel damascene structures. These systems include a controller (1100) which is adapted for interacting with a plurality of fabrication stations (1120, 1122, 1124, 1126, 1128, 1130 and 1132).

22 Claims, 16 Drawing Sheets

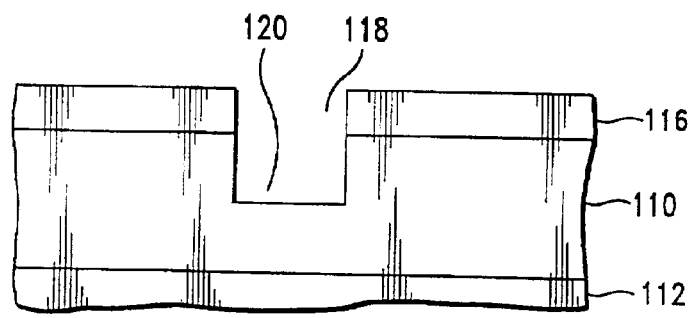
FIG.—1A
(PRIOR ART)
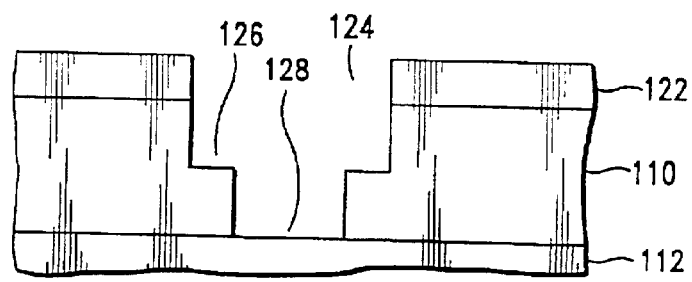
FIG.—1B
(PRIOR ART)
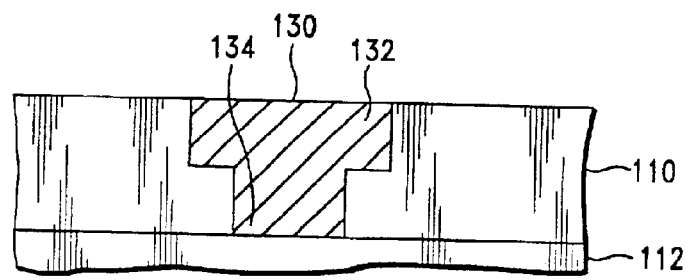
FIG.—1C
(PRIOR ART)
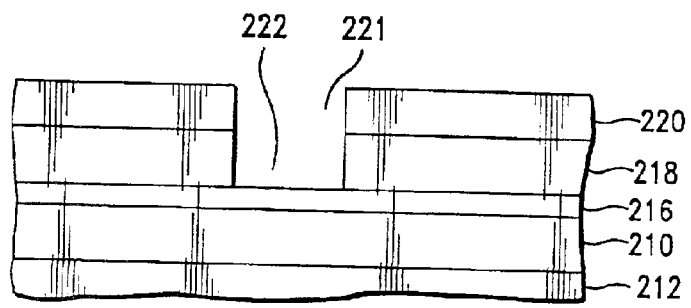
FIG.—2A
(PRIOR ART)

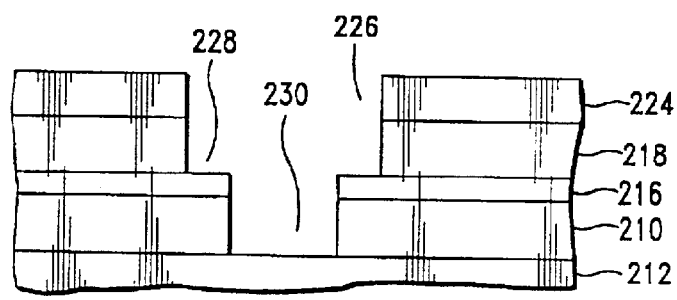
*FIG.—2B*
(PRIOR ART)
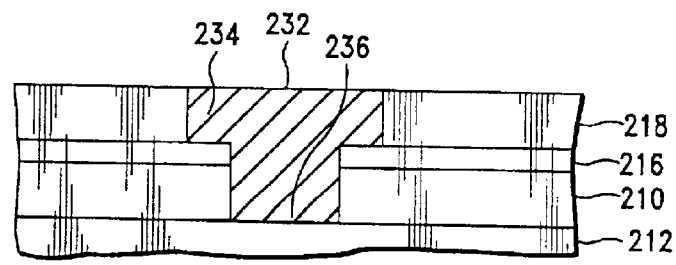
*FIG.—2C*
(PRIOR ART)
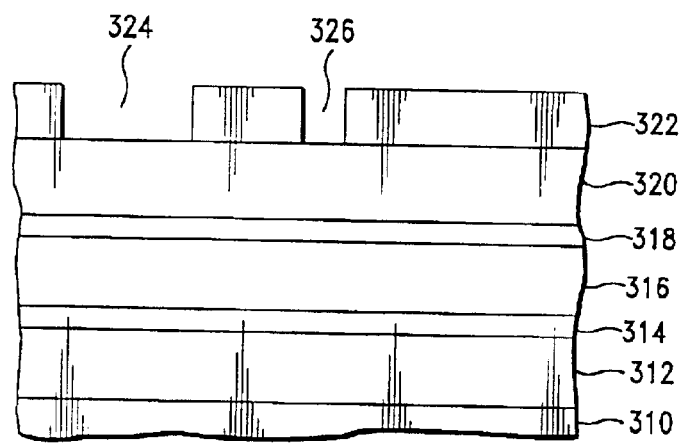
*FIG.—3A*
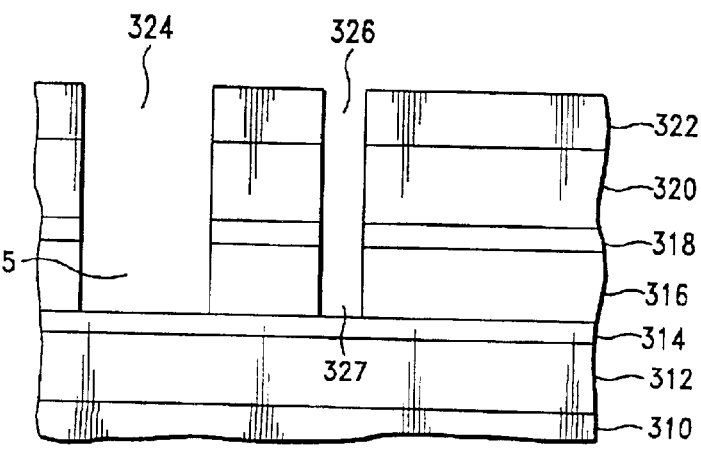
*FIG.—3B*

TECHNIQUES FOR TRIPLE AND QUADRUPLE DAMASCENE FABRICATION

This application is a DIV of 09/165,233 Oct. 1, 1998 now U.S. Pat. No. 6,225,207.

FIELD OF THE INVENTION

The present invention relates to semiconductor device interconnect lines and via plugs which are fabricated using damascene techniques.

BACKGROUND OF THE INVENTION

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Advances in semiconductor materials and processing techniques have resulted in reducing the overall size of the IC circuit elements while increasing their number on a single body. Additional miniaturization is highly desirable for improved IC performance and cost reduction. Interconnects provide the electrical connections between the various electronic elements of an IC and they form the connections between these elements and the device's external contact elements, such as pins, for connecting the IC to other circuits. Typically, interconnect lines form horizontal connections between electronic circuit elements while conductive via plugs form vertical connections between the electronic circuit elements, resulting in layered connections.

A variety of techniques are employed to create interconnect lines and via plugs. One such technique involves a process generally referred to as dual damascene, which includes forming a trench and an underlying via hole. The trench and the via hole are simultaneously filled with a conductor material, for example a metal, thus simultaneously forming an interconnect line and an underlying via plug. Examples of conventional dual damascene fabrication techniques are disclosed in Kaanta et al., "Dual Damascene: A ULSI Wiring Technology", Jun. 11–12, 1991, VMIC Conference, IEEE, pages 144–152 and in U.S. Pat. No. 5,635,423 to Huang et al., 1997.

An example of a prior art dual damascene technique is illustrated in FIGS. 1A–1C, showing various IC structures. As depicted in FIG. 1A, a dielectric layer 110 is deposited on a semiconductor substrate 112. An etch mask 116, having a via pattern 118, is positioned on dielectric layer 110. A timed anisotropic etch is utilized to etch a hole 120 in layer 110 conforming to the via pattern. Mask 116 is subsequently replaced by mask 122 (FIG. 1B) having a trench pattern 124. A timed anisotropic etch is used to form trench 126 and to simultaneously deepen hole 120 to form via hole 128. This via hole can be etched to expose semiconductor substrate 112. Alternatively, the via hole can be over-etched partly into the substrate. As illustrated in FIG. 1C, the via hole and trench are then filled simultaneously with a suitable metal 130. Metal 130 thus forms a metallized interconnect line 132 and a via plug 134 which is in contact with semiconductor substrate 112. Additionally, a liner or barrier layer may be deposited inside the via hole and the trench prior to deposition of the interconnect metal and the via plug. The surface of layer 110 is planarized to remove excess metal 130 and to define interconnect line 132. Alternately, metal etch-back can be utilized to define the line.

Another example of prior art dual damascene is shown in IC structures illustrated in FIGS. 2A–2C. As depicted in FIG. 2A, a first dielectric layer 210 is deposited on a semiconductor substrate 212. An etch stop layer 216, is deposited on first dielectric layer 210. A second dielectric layer 218 is deposited on etch stop 216, and an etch mask 220 is positioned on dielectric layer 218. Etch mask 220 is patterned (221) for etching a via hole. Second dielectric layer 218 is etched using a first anisotropic etch procedure, to form a hole 222 (FIG. 2A) conforming to the via pattern. This etching procedure is stopped at etch stop layer 216. Etch mask 220 is removed and another etch mask 224 (see, FIG. 2B) is positioned on second dielectric layer 218 such that it is patterned (226) for forming a trench. A second anisotropic etch procedure is used to etch trench 228 in layer 218. Simultaneously, hole 222 is extended to substrate 212, by etching through etch stop layer 216 and through first dielectric layer 210. In this dual damascene technique the first etch procedure has a greater selectivity to etch stop layer 216 than the second etch procedure. As shown in FIG. 2B, the second etch procedure results in forming trench 228 and via hole 230 which extends to semiconductor substrate 212. Mask 224 is removed, after which trench 228 and via hole 230 are simultaneously filled with a suitable conductive metal 232 (see, FIG. 2C) forming metallized line 234 and via plug 236 which contacts substrate 212. Excess metal 232 is removed from the surface of layer 218 to define line 234.

Conventional dual damascene techniques, such as those exemplified above, have shortcomings for fabricating structures which include power interconnect lines as well as signal interconnect lines. Power lines, which are fabricated for conducting a relatively high current, generally have a greater thickness and pitch than signal lines. Consequently, power lines typically extend through more dielectric layers or interconnect levels than signal lines which are fabricated in the same structure. One conventional technique for fabricating a structure including a power line and a signal having an underlying via plug includes etching the signal line trench to the same depth as the power line trench. Subsequently, both trenches and the underlying via holes are simultaneously filled with a conductive material. This results in a deep and narrow signal line which is difficult to fill reliably with metal. Also, such a deep and narrow signal line results in an undesirable increase in intermetal capacitance. In another conventional technique, the power line and signal line with an underlying via plug are fabricated in different interconnect levels, thereby requiring one or more additional interconnect levels, additional metal fill processing steps and one or more additional mask layers, in order to meet the different design rule requirements regarding line pitch and thickness for power lines and signal lines. This latter technique is not suitable for simultaneously filling a power line trench and a signal line trench of a damascene structure with a conductive material because these different trenches are not accessible for filling with metal at the same interconnect level.

Accordingly, a need exists for cost effective, improved techniques for damascene fabrication, wherein a power line and a signal line are simultaneously formed.

SUMMARY OF THE INVENTION

The present invention provides novel methods and structures for damascene containing integrated circuit devices which overcome the prior art problems described above.

In one embodiment of the present invention, a first dielectric layer is deposited on a substrate, such as a semiconductor substrate. Subsequently, second, third, fourth and fifth dielectric layers are deposited. The first and fifth dielectric layers have similar etching characteristics, i.e. the layers are capable of being etched at similar etching rates in a particular etch chemistry. Also, the first, third and fifth dielectric layers have etching characteristics which are dissimilar from those of the second and fourth dielectric layers, i.e. the etching properties of these materials are such that first, third and fifth dielectric layers etch at a different rate than the second and fourth dielectric layers in a specific etch chemistry. A first etch mask, patterned for a power line trench and a via, is formed on the fifth dielectric layer. A first etching sequence is used to simultaneously anisotropically etch the power line trench pattern and the via pattern through the fifth, fourth and third dielectric layers. The second dielectric layer is an etch stop for the first etching sequence. The first etch mask is then removed.

In a second etching sequence, a second mask layer is deposited on the fifth dielectric layer and inside the power line trench formed in the first etching sequence. The second mask layer is developed for a signal line trench mask overlaying the via pattern. The via pattern is anisotropically etched through the second dielectric layer, wherein the fifth etch layer forms a via etch mask. The signal line trench pattern is then anisotropically etched through the fifth dielectric layer thereby forming a signal line trench, wherein the fourth dielectric layer is an etch stop layer for forming this signal line trench. The via pattern is anisotropically etched through the first dielectric layer, simultaneously with etching the signal line trench, thereby forming a via hole extending from the signal line trench to the substrate. The second mask layer is removed, completing the second etching sequence. This results in a signal line trench and a power line trench which are accessible for filling with conductive material at the same interconnect level.

The power line trench, signal line trench and underlying via hole are simultaneously filled with a conductive material, such as a metal, to form a novel triple damascene structure. A suitable dielectric stack for the present embodiment includes first, third and fifth dielectric layers comprising materials having a low dielectric constant, while utilizing oxide dielectric materials in the second and fourth dielectric layers. Materials having a low dielectric constant include organic spin-on materials, spin-on-glass and poly (arylene) ethers. Suitable oxide materials include $SiO_2$ and $F-SiO_2$. The present embodiment of the invention advantageously employs three design rules requiring only two masks and only one planarizing or etch back step. Also, the present embodiment results in a power line extending through three dielectric layers while the simultaneously formed signal line extends only through one dielectric layer thus overcoming the prior art problem of deep and narrow signal line trenches in structures wherein the power and signal lines are simultaneously filled.

In another embodiment of the present invention, a novel quadruple damascene structure is formed using the five dielectric layers exemplified in the previous embodiment. The first etching sequence is similar to the above embodiment, resulting in a power line trench and a first via pattern extending through the fifth, fourth and third layers. The second etching sequence of this embodiment employs a second etch mask layer on the fifth dielectric layer and inside the power line trench. This mask layer includes a signal line trench pattern overlaying the via pattern as well as a second via pattern inside the power line trench. The first and second via patterns are simultaneously anisotropically etched through the second dielectric layer. Subsequently, the signal line trench pattern is anisotropically etched through the fifth dielectric layer forming a signal line trench. The signal line pattern is etched simultaneously with anisotropically etching the first and second via patterns through the first dielectric layer, forming first and a second via holes respectively. The first via hole extends from the power line trench to the substrate, while the second via hole extends from the signal line trench to the substrate. The second mask layer is then removed. The resulting novel structure includes a power line trench extending through three dielectric layers and having an underlying via hole. The structure also includes a signal line trench extending through one dielectric layer and having an underlying via hole. Both via holes extend to the substrate. Typically, via holes underlying power trenches are wider than via holes underlying signal line trenches. The power line trench, signal line trench and two via holes are simultaneously filled with a conductive material, forming a quadruple damascene structure, which uses four design rules.

In yet another embodiment of the present invention, a structure is fabricated employing a cap layer which is interposed between a substrate and the five dielectric layers which are described in connection with the above embodiments. This embodiment utilizes a first etching sequence similar to the previous embodiments. The second etching sequence uses a mask layer which is deposited on the fifth dielectric layer and inside the power line trench which is formed in the first etching sequence. A signal line trench pattern is formed in this mask layer such that this pattern overlays the via pattern which is formed in the first etching sequence. The via pattern is anisotropically etched through the second dielectric layer. The signal line trench mark is anisotropically etched through the fifth layer while the via pattern is simultaneously anisotropically etched through the first dielectric layer. The mask layer is then removed. In a simultaneous anisotropic etching process, the power line trench is extended by etching through the second dielectric layer, the signal line trench pattern is etched through the fourth dielectric layer and the via pattern is etched through the cap layer. The structure thus fabricated includes a power line trench extending through the fifth, fourth, third and second dielectric layers, a signal line trench extending through the fifth and fourth dielectric layers and having an underlying via hole extending to the substrate. The power line trench, signal line trench and underlying via hole are simultaneously filled with a conductive material, forming a triple damascene structure. Three design rules are used in this structure.

In an additional embodiment the above techniques are used to form a novel quadruple damascene structure employing a cap layer and five dielectric layers. This quadruple damascene structure provides a power line extending through the fifth, fourth, third and second dielectric layers, a signal line extending through the fifth and fourth dielectric layers, a first via plug extending from the power line to the substrate and a second via plug extending from the signal line to the substrate. Four design rules are used in the fabrication of this quadruple damascene structure.

In another embodiment of the present invention, first, second and third dielectric layers are sequentially deposited on a substrate, such as a semiconductor substrate. The first and third dielectric layers of this structure have similar etching characteristics. The etching characteristics of the first and third dielectric layers are dissimilar from the etching characteristics of the second dielectric layer. A mask layer having a power line trench pattern and a via pattern is deposited on the third dielectric layer. A power line trench and a via pattern are simultaneously anisotropically etched through the third and second dielectric layers in a first etching sequence. A second etching sequence, analogous to the above embodiments, is employed to anisotropically etch a signal line trench through the third dielectric layer and to simultaneously anisotropically etch the via pattern through the first dielectric layer, forming a via hole which extends from the signal line trench to the substrate. The power line trench, signal line trench and underlying via hole are simultaneously filled with a conductive material forming a novel triple damascene structure employing three design rules.

In still another embodiment, a novel quadruple damascene structure is formed employing the three above exemplified dielectric layers which are deposited on a substrate. Two etching sequences, similar to those described in previous embodiments are utilized to form a structure including a power line trench extending through the third and second dielectric layers, a signal line trench extending through the first dielectric layer, a first via hole connecting the power line trench to the substrate and a second via hole connecting the signal line trench to the substrate. The power line trench, signal line trench and both via holes are simultaneously filled with a conductive material, resulting in a quadruple damascene structure including a power line, a signal line and two via plugs. Four design rules are used in this inventive technique.

In still another embodiment, three dielectric layers having similar etching characteristics are sequentially deposited on a substrate. In a first etching sequence, a timed anisotropic etch is used to form a power line trench through the third and second dielectric layers. Simultaneously, a timed anisotropic etch is used to etch a via pattern through the third and second dielectric layers. A second etching sequence is employed wherein a simultaneous timed anisotropic etch is used to form a signal line in the third dielectric layer and to form a via hole extending through the first dielectric layer. The power line trench, signal line trench and via hole are simultaneously filled with a conductive material, thus fabricating a novel triple damascene structure using three design rules.

In another embodiment, techniques analogous to those described above, are used to form a novel quadruple damascene structure using timed anisotropic etches of a structure containing three dielectric layers having similar etching characteristics. This quadruple damascene structure uses four design rules.

The inventive techniques for fabricating triple and quadruple damascene structures described in the above embodiments advantageously require only two etch mask layers and need only one planarizing or etch back step to define the interconnect lines. The power lines in each of these novel structures extend through more interconnect lines than the signal lines, but they require only one conductive fill step because the respective trenches are accessible for filling with conductive material at the same interconnect level.

In additional embodiments of the present invention, manufacturing systems are provided for forming fabricated structures, such as the IC structures of the present invention. These systems include a controller, such as a computer, which is adapted for interacting with a plurality of fabrication stations. Each of these fabrication stations performs a processing step which is utilized to fabricate the IC structures. Operative links provide connections between the controller and the manufacturing stations. A data structure, such as a computer program, causes the controller to control the processing steps which are performed at the fabrication stations. The data structure can be provided on a removable electronic storage medium.

BRIEF DESCRIPTION OF THE DRAWINGS

FIGS. 1A–1C are schematic cross-sectional side views illustrating prior art IC structures at sequential stages.

FIGS. 2A–2C are schematic cross-sectional side views illustrating prior art IC structures at sequential stages.

FIGS. 3A–3G are schematic cross-sectional side views illustrating an embodiment of IC structures of the present invention at sequential stages.

DETAILED DESCRIPTION OF THE INVENTION

While describing the invention and its embodiments, certain terminology will be utilized for the sake of clarity. It is intended that such terminology include not only the recited embodiments but all equivalents which perform substantially the same function, in substantially the same manner to achieve the same result.

In one embodiment of the invention, a novel damascene process is employed to fabricate structures including a power line trench and two signal line trenches, wherein one of the signal line trenches has an underlying via hole. These trenches are utilized to form a power interconnect line to carry power and signal interconnect lines to carry IC signals. A power line has substantially greater thickness and pitch than a signal line, as is well known to those of ordinary skill in the art. The inventive process is illustrated in fabricated structures, such as the IC structures shown in FIGS. 3A–3G. The expression "integrated circuit structure" as defined herein, includes completely formed integrated circuits and partially formed integrated circuits. The structures depicted in FIGS. 3A–3G employ a dielectric stack comprising five dielectric layers, including two etch stop layers.

Figure 3C:
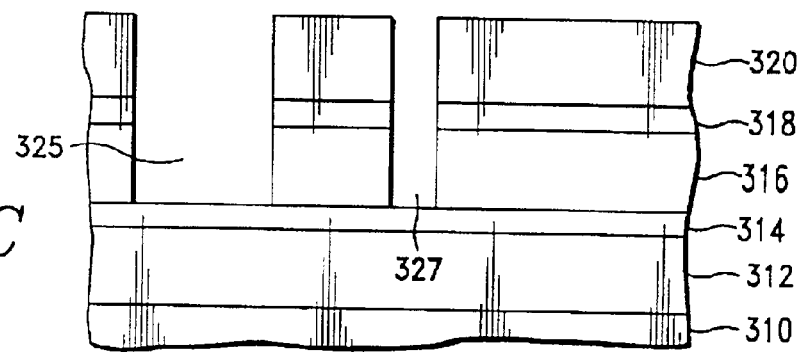

FIG. 3A shows a first dielectric layer 312 which is deposited on a substrate, such as semiconductor substrate 310. The expression "semiconductor substrate" as defined herein, includes structures and devices comprising typical IC elements, components, interconnects and semiconductor materials. A second dielectric layer 314 is deposited on first dielectric layer 312. Subsequently, a third dielectric layer 316, a fourth dielectric layer 318 and a fifth dielectric layer 320 are deposited. A first photoresist layer 322 is deposited on fifth dielectric layer 320. Dielectric layers 312 and 320 have similar etching characteristics. The expression "similar etching characteristics" of two or more materials as defined herein, includes etching properties of these materials such that the materials are capable of being etched at similar etching rates in a particular etch chemistry. Dielectric layers 314 and 318 are etch stop layers having similar etching characteristics. The dielectric and photoresist layers depicted in FIGS. 3A–3G can be deposited by any of the methods which are well known to those of ordinary skill in the art.

First photoresist 322 (FIG. 3A) is patterned for a power line trench 324 and a via hole 326. As depicted in FIG. 3B, trench pattern 324 and via pattern 326 are anisotropically etched through dielectric layer 320. The two patterns are then anisotropically etched through dielectric (etch stop) layer 318. This is followed by anisotropically etching the patterns through dielectric layer 316, wherein dielectric layer 314 is an etch stop for this etching step. This etching procedure results in forming a power line trench 325 and a via hole 327 (FIG. 3B). The etch chemistries which are used to etch dielectric layers 316, 318 and 320 need to be selective with respect to first photoresist layer 322. Where two materials are exposed to a particular etching process, the etching process is defined herein as being selective with respect to one of the materials when this material is etched at a significantly slower rate than the other material. First photoresist layer 322 is stripped after trench 325 and via hole 327 are formed, as shown in FIG. 3C.

Figure 3D:
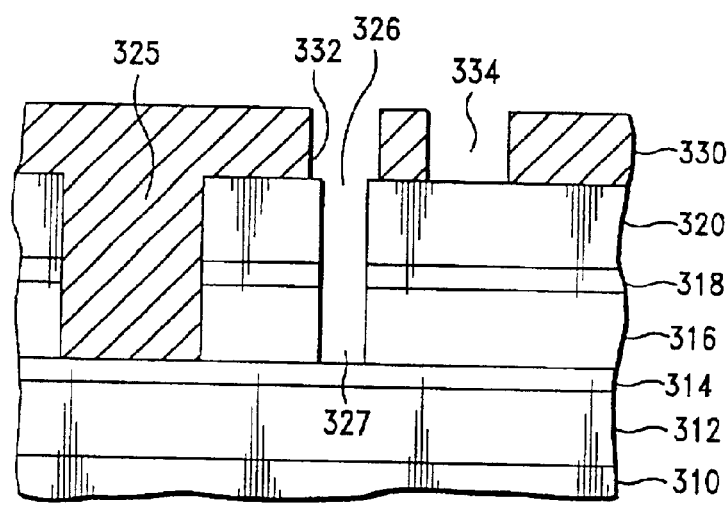

A second photoresist layer 330 is deposited on fifth dielectric layer 320, as illustrated in FIG. 3D. This resist also fills power line trench 325. A first signal line trench pattern 332 is developed in photoresist 330, overlaying via pattern 326 which is formed in layer 320. Resist layer 330 is also patterned for a second signal line trench 334. It will be noted that signal line trench pattern 332 results in removing any resist 330 material which may be present in via hole 327. Via pattern 326 is then anisotropically etched through dielectric (etch stop) layer 314, stopping on first dielectric layer 312. This procedure requires that layers 312 and 314 have dissimilar etching characteristics. The expression "dissimilar etching characteristics" of two materials as defined herein, includes etching properties of these materials such that one of the materials has a higher etch rate than the other material in a specific etch chemistry. The procedure illustrated in FIG. 3D also requires that layers 314 and 320 have dissimilar etching characteristics.

Figure 3E:
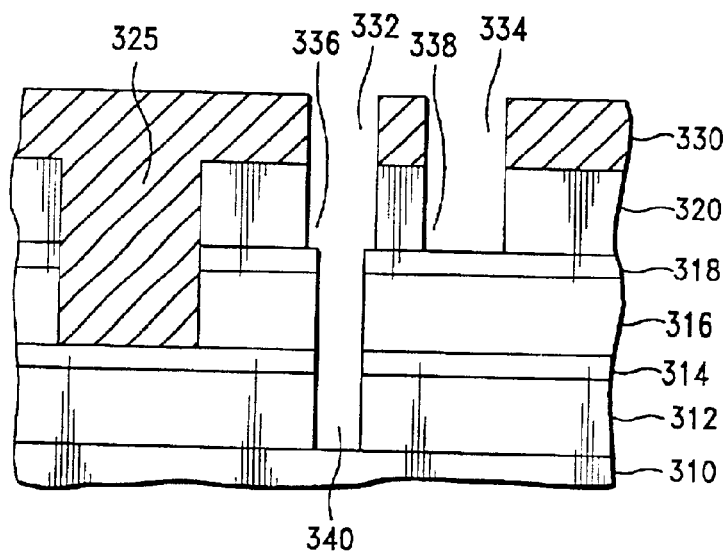
Figure 3F:
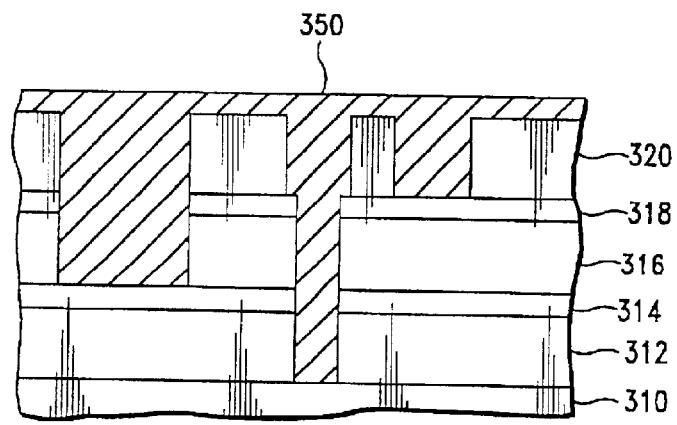

As depicted in FIG. 3E, signal line trench patterns 332 and 334 are anisotropically etched through fifth dielectric layer 320, forming signal line trenches 336 and 338 respectively. Simultaneously, via hole 327 is extended by anisotropically etching the via pattern through first dielectric layer 312, thereby forming via hole 340 extending through dielectric layers 312, 314, 316 and 318. Via hole 340 extends from signal line trench 336 to substrate 310. The etching procedure illustrated in FIG. 3E requires that dielectric layers 312 and 320 have similar etching characteristics, while layer 318 needs to have dissimilar etching characteristics with regard to layers 312 and 320. The etch chemistries which are used to etch dielectric layers 312, 314 and 320 need to be selective with respect to second photoresist layer 330.

Second photoresist 330 is stripped from layer 320 and from power line trench 325. The trenches and via hole are then simultaneously filled, see FIG. 3F, with an electrically conductive material, such as a metal 350. Excess conductive material 350 is removed (FIG. 3G) from the surface of fifth dielectric layer 320, for example using conventional CMP (chemical-mechanical polishing), or using conventional metal etch back to form a novel triple damascene structure comprising power line 352 and signal line 354 with underlying via plug 356 contacting substrate 310. The expression "triple damascene structure" as defined herein, includes a power line and a signal line having an underlying via plug which are formed simultaneously such that the lines are formed in trenches. The inventive triple damascene techniques shown in the structures illustrated in FIGS. 3A–3G employ the fabrication of three design rules in the simultaneous formation of a power line and a signal line wherein the signal line has a via plug for electrically connecting the signal line to a substrate. The term "design rule" as defined herein, includes design parameters of interconnect lines and via plugs wherein the line design rule includes the line width and height as well as its minimum spacing relative to adjacent lines at the same interconnect level, and wherein the via plug design rule includes the via plug width and height. For example, two adjacent interconnect lines having the same height and width represent one design rule, whereas two adjacent lines having the same width but having different heights comprise two design rules. The three design rule patterns of the present invention require only two masks. Advantageously, the novel technique needs only a single metal fill for all three patterns and requires only one planarizing step, resulting in reduced fabrication costs as compared with conventional techniques.

Figure 3G:
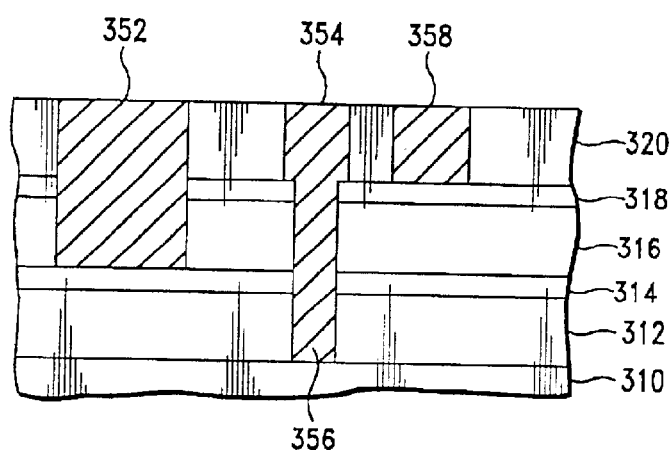

The three design rule power line, signal line and via plug of the inventive triple damascene structure extend through various dielectric layers, see Table A with reference to FIG. 3G.

TABLE A

| Design Rule | Dielectric Layer |
| --- | --- |
| Power line (352) | third (316), fourth (318) and fifth (320) |
| Signal line (354) | fifth (320) |
| Via plug (356) | first (312), second (314), third (316) and fourth (318) |

In summary, formation of the fabricated structures illustrated in FIGS. 3A–3G includes two etching sequences as follows. A first etching sequence comprising: depositing a first etch mask layer, such as a photoresist, on the fifth dielectric layer, developing a power line trench pattern and a via pattern in the first mask layer, simultaneously etching the power line trench pattern and the via pattern through the fifth, fourth and third dielectric layers, and removing the first etch mask layer. A second etching sequence including: depositing a second etch mask layer, such as a photoresist, on the fifth dielectric layer and inside the power line trench formed in the first etching sequence, developing a signal line pattern overlaying the via pattern in the second etch layer, etching the via pattern through the second dielectric layer, and subsequently etching the via pattern through the first dielectric layer while simultaneously etching the signal line trench pattern through the fifth dielectric layer. The structures shown in FIGS. 3A–3G also illustrate the simultaneous fabrication of a signal line 358 which is formed without a via plug. Line 358 extends through fifth dielectric layer 320.

The inventive techniques of the present embodiment are suitable for a variety of dielectric stacks, providing that the etch selectivity and etching characteristics of the materials meet the criteria which are described in connection with FIGS. 3A–3G. Examples of suitable dielectric stack materials for second and third dielectric layers 314 and 318 include oxides such as PECVD (plasma-enhanced chemical vapor deposition) $SiO_2$ and F—$SiO_2$, while suitable dielectric materials for the first, third and fourth dielectric layers 312, 316 and 320 include materials having a low dielectric constant (k), such as polymers, for example amorphous fluorinated carbon based materials, spin-on dielectric polymers such as fluorinated and non-fluorinated poly(arylene) ethers (commercially known as FLARE 1.0 and 2.0, which are available from Allied Signal Company), poly(arylene) ethers (commercially known as PAE 2-3, available from Schumacher Company), divinyl siloxane benzocyclobutane (DVS-BCB) or similar products and aero-gel. These dielectric materials are well known to those of ordinary skill in the art. Materials having a low dielectric constant as defined herein include materials having a dielectric constant <3.5. The oxides and the polymers have dissimilar etching characteristics because etch chemistries used for polymer etching, such as $O_2$-based etch chemistries, are highly selective with respect to $SiO_2$. On the other hand, $CHF_x$-based chemistry typically used for etching $SiO_2$ is highly selective with respect to polymer.

Another example of a suitable dielectric stack for the structures shown in FIGS. 3A–3G includes second and fourth layer dielectric materials comprising nitride, such as CVD (chemical vapor deposition) silicon nitride, while the first, third and fifth layer dielectric materials include oxides, such as PECVD $SiO_2$ and F—$SiO_2$.

Figure 4A:
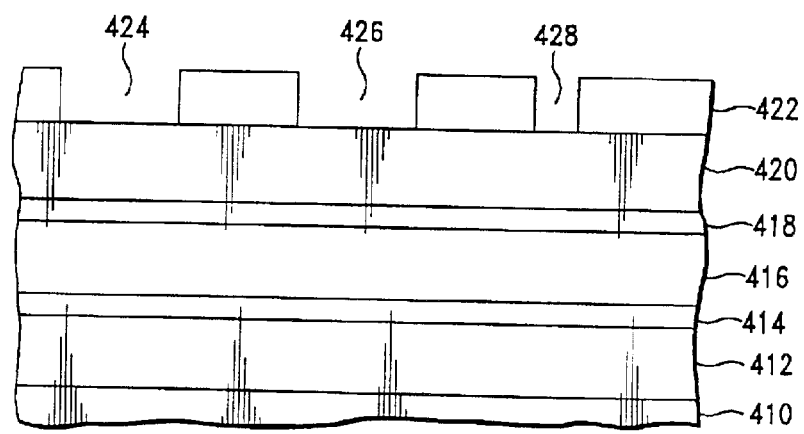
FIGS. 4A–4F are schematic cross-sectional side views illustrating another embodiment of IC structures of the present invention at sequential stages.
Figure 4B:
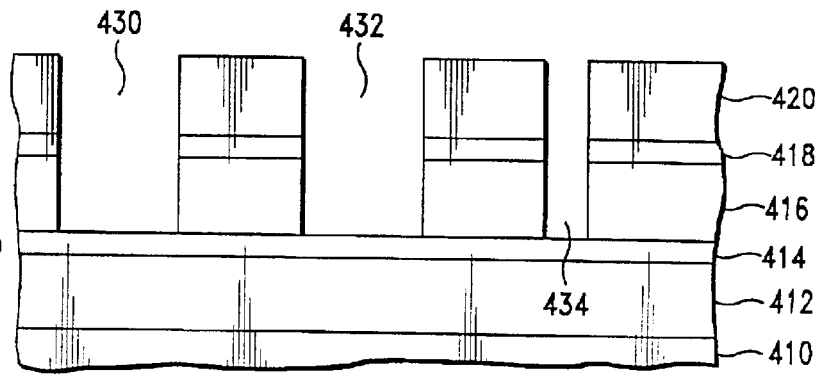

In another embodiment of the present invention, the novel damascene process is utilized to form structures, such as an IC structures, as illustrated in FIGS. 4A–4F. FIG. 4A shows a dielectric stack comprising five dielectric layers similar to the dielectric stack depicted in FIGS. 3A–3G. First dielectric layer 412 is deposited on substrate 410. Subsequently, a second dielectric layer 414, a third dielectric layer 416, a fourth dielectric layer 418 and a fifth dielectric layer 420 are deposited. A first photoresist layer 422 is deposited on fifth dielectric layer 420. Dielectric layers 412 and 420 have similar etching characteristics. Dielectric layers 414 and 418 are etch stop dielectric layers having similar etching characteristics. The dielectric and photoresist layers depicted in FIG. 4A can be deposited by any of the methods which are well known to those of ordinary skill in the art.

Figure 4C:
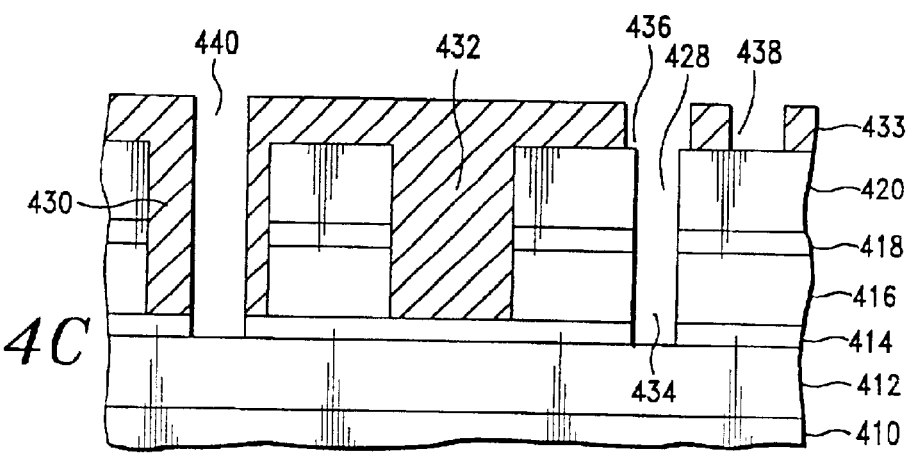

First photoresist 422 (FIG. 4A) is patterned for a first power line trench 424, a second power line trench 426 and a via hole 428. Power line trench patterns 424 and 426, and via pattern 428 are anisotropically etched through fifth, fourth, and third dielectric layers 420, 418 and 416 in a similar manner as described in connection with FIG. 3B. First resist layer 422 is then stripped, resulting in the structure shown in FIG. 4B which includes power line trenches 430 and 432, and via hole 434. As is illustrated in FIG. 4C, a second photoresist 433 is deposited on dielectric layer 420 and in power line trenches 430 and 432. Second photoresist 433 can also be deposited in via hole 434. Second photoresist 433 is patterned for a via hole 440 in power line trench 430. A first signal line trench pattern 436 is developed in photoresist 433, overlaying via pattern 428 in layer 420. It will be noted that signal line trench pattern 436 results in removing any resist 433 which may be present in via hole 434. Via patterns 428 and 440 are then anisotropically etched through second dielectric (etch stop) layer 414, stopping on first dielectric layer 412, see FIG. 4C. This procedure requires that layers 412 and 414 have dissimilar etching characteristics. It also requires that layers 414 and 420 have dissimilar etching characteristics, because layer 420 forms the etch mask for etching via pattern 428 through layer 414.

Figure 4D:
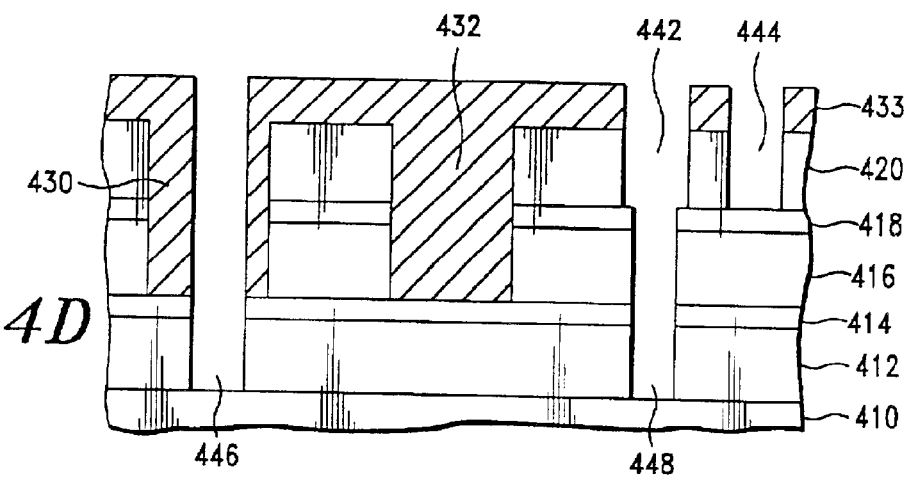

As illustrated in FIG. 4D, signal line trench patterns 436 and 438 are anisotropically etched through fifth dielectric layer 420, forming signal line trenches 442 and 444 respectively. Layer 418 is an etch stop layer for etching signal line trenches 442 and 444. Simultaneously, the via patterns are etched through first dielectric layer 412, forming via hole 446 (FIG. 4D) underlying power line trench 430 and via hole 448 underlying signal line trench 442. These via holes extend to substrate 410. The etching characteristics of the dielectric layers illustrated in FIG. 4D are similar to the characteristics of the corresponding layers of the structure depicted in FIG. 3E. Typically, via holes underlying power trenches are wider than via holes underlying signal line trenches because via plugs underlying power lines have a greater diameter than via plugs underlying signal line trenches because the power line via plugs are fabricated for conducting a relatively high current.

Figure 4E:
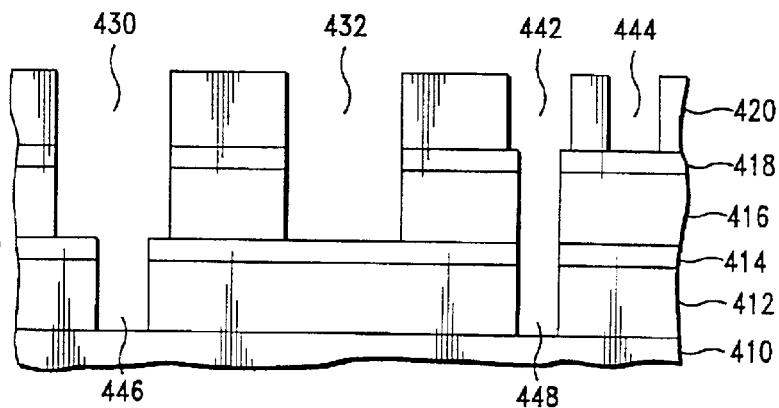
Figure 4F:
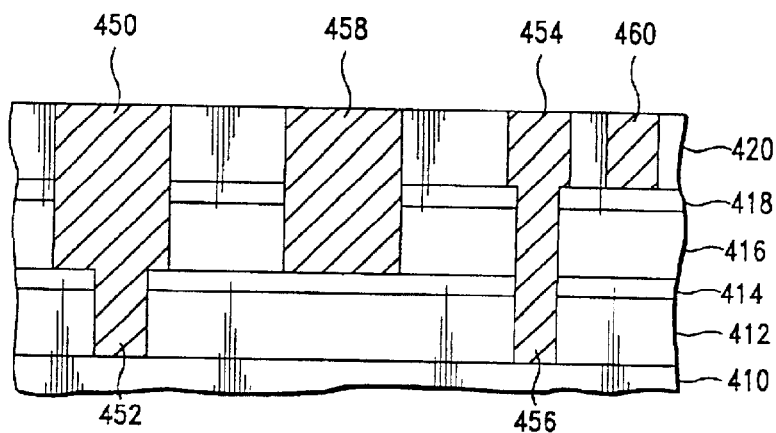

Photoresist 433 is stripped from layer 420 and from power line trenches 430 and 432, as shown in FIG. 4E. Via holes 446 and 448, power line trenches 430 and 432, and signal line trenches 442 and 444 are then simultaneously filled with an electrically conductive material, such as a metal. Excess conductive material is removed from the surface of fifth dielectric layer 420 (see FIG. 4F) using for example conventional CMP or conventional etch back to define the interconnect lines. The inventive structure shown in FIG. 4F is a novel quadruple damascene structure. The expression "quadruple damascene structure" as defined herein, includes a power line and a signal line each having an underlying via plug wherein the lines and via plugs are fabricated simultaneously such that the lines are formed in trenches. These quadruple damascene structures use four design rules, including a power line 450 having an underlying via plug 452, and a signal line 454 having an underlying via plug 456. Lines 450 and 454, and via plugs 452 and 456 extend through various dielectric layers of the novel structures as shown in Table B with reference to FIG. 4F.

TABLE B

| Design Rule | Dielectric Layer |
| --- | --- |
| Power line (450) | third (416), fourth (418) and fifth (420) |
| Power line via plug (452) | first (412) and second (414) |
| Signal line (454) | fifth (420) |
| Signal line via plug (456) | first (412), second (414), third (416) and fourth (418) |

The structures shown in FIGS. 4A–4F also illustrate the simultaneous fabrication of a power line 458 without a via plug and a signal line 460 without a via plug, wherein the power line extends through layers 416, 418 and 420 while signal line 460 extends through layer 420.

Figure 5A:
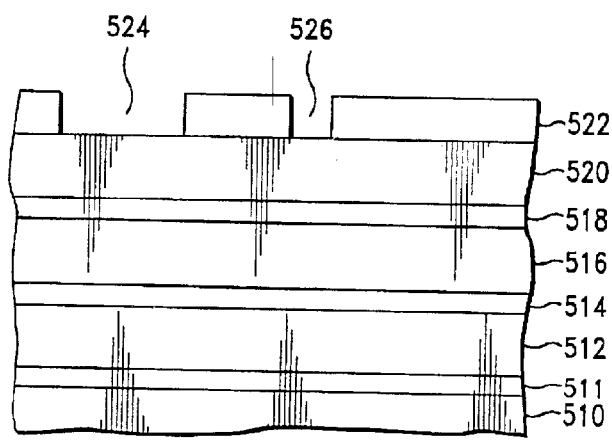
FIGS. 5A–5D are schematic cross-sectional side views illustrating another embodiment of IC structures of the present invention at sequential stages.
Figure 5B:
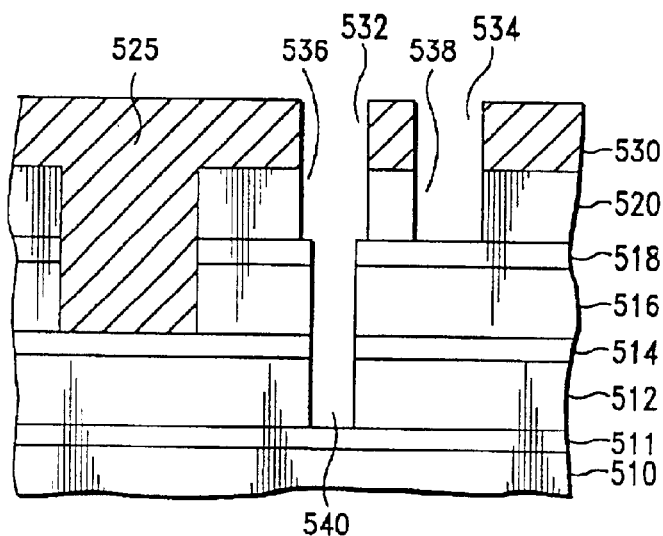

The novel techniques are also suitable for triple and quadruple damascene fabrication in structures which employ a cap layer interposed between the substrate and the first dielectric layer of the structures illustrated in FIGS. 3A–3G and 4A–4F. Embodiments of the present invention utilizing a cap layer are depicted in FIGS. 5A–5D, 6A and 6B. The structure shown in FIG. 5A includes a cap layer 511 which is deposited on a substrate, such as a semiconductor substrate 510. A first dielectric layer 512, a second dielectric layer 514, a third dielectric layer 516, a fourth dielectric layer 518 and a fifth dielectric layer 520 are subsequently deposited, similar to the five dielectric layers employed in the structure shown in FIG. 3A. A first photoresist layer 522 having a power line trench pattern 524 and a via pattern 526 is deposited on dielectric layer 520, see FIG. 5A. The cap, dielectric and photoresist layers depicted in FIG. 5A can be deposited by any of the methods which are well known to those of ordinary skill in the art. Employing the techniques of the present invention described in connection with FIGS. 3B–3D, the structure shown in FIG. 5B is formed. This structure includes a second photoresist 530 deposited on layer 520 and in power line trench 525. Signal line trench patterns 532 and 534 are developed in the second photoresist. Signal line trenches 536 and 538 are then fabricated by anisotropical etching using patterns 532 and 534.

Figure 5C:
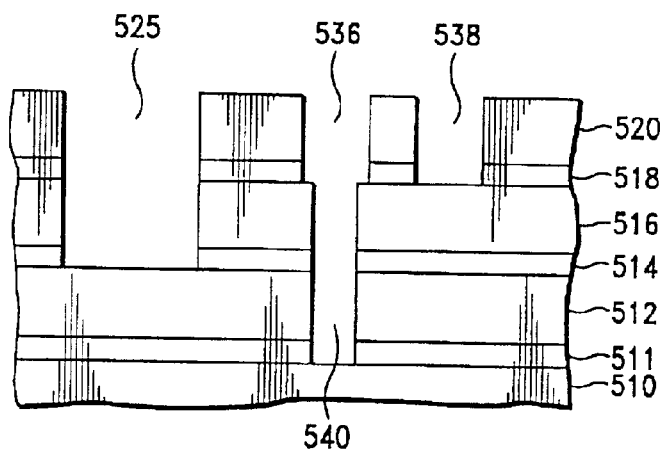
Figure 5D:
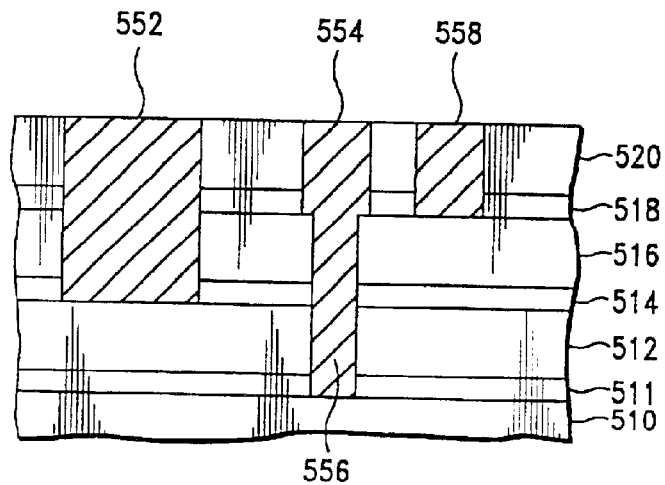

Resist 530 is stripped from the surface of layer 520 and from power line trench 525, as shown in FIG. 5C. An anisotropic etching procedure is subsequently utilized to simultaneously etch: via hole 540 through cap layer 511, power line trench 525 through dielectric (etch stop) layer 514 and signal line trenches 536 and 538 through dielectric (etch stop) layer 518. Layer 516 is the etch mask for forming via hole 540 in this procedure. The novel techniques utilized in the formation of the structure shown in FIG. 5C employ dielectric layers which have etching characteristics similar to those of the corresponding layers described in connection with FIGS. 3A–3G. Additionally, layers 511, 514 and 518 of FIGS. 5A–5C need to have similar etching characteristics while layers 511 and 516 require dissimilar etching characteristics.

Via hole 540, power line trench 525 and signal line trenches 536 and 538 are simultaneously filled with a conductive material, such as a metal. Excess conductive material is removed from the surface of layer 520, using conventional techniques such as CMP or etch back, resulting in the structure depicted in FIG. 5D. This structure includes a novel triple damascene structure comprising a power line 552 and a signal line 554 having a via plug 556. An additional signal line 558 without a via plug can be fabricated simultaneously with the triple damascene structure. This triple damascene structure uses three design rules as shown in Table C with reference to FIG. 5D.

TABLE C

| Design Rule | Cap Layer or Dielectric Layer |
| --- | --- |
| Power line (552) | second (514), third (516), fourth (518) and fifth (520) |
| Signal line (554) | fourth (518) and fifth (520) |
| Via plug (556) | cap (511), first (512), second (514) and third (516) |

In summary, formation of the fabricated structures illustrated in FIGS. 5A–5D includes two etching sequences as follows. A first etching sequence comprising: depositing a first etch mask layer, such as a photoresist, on the fifth dielectric layer, developing a power line trench pattern and a via pattern in the first mask layer, simultaneously etching the power line trench pattern and the via pattern through the fifth, fourth and third dielectric layers, and removing the first etch mask layer. A second etching sequence including: depositing a second etch mask layer, such as a photoresist, on the fifth dielectric layer and inside the power line trench formed in the first etching sequence, developing a signal line pattern overlaying the via pattern in the second etch layer, etching the via pattern through the second dielectric layer, and subsequently etching the via pattern through the dielectric first layer while simultaneously etching the signal line trench pattern through the fifth dielectric layer, removing the second mask layer and simultaneously etching the via pattern through the cap layer, etching the power line pattern through the second dielectric layer and etching the signal line trench pattern through the fourth dielectric layer.

Figure 6A:
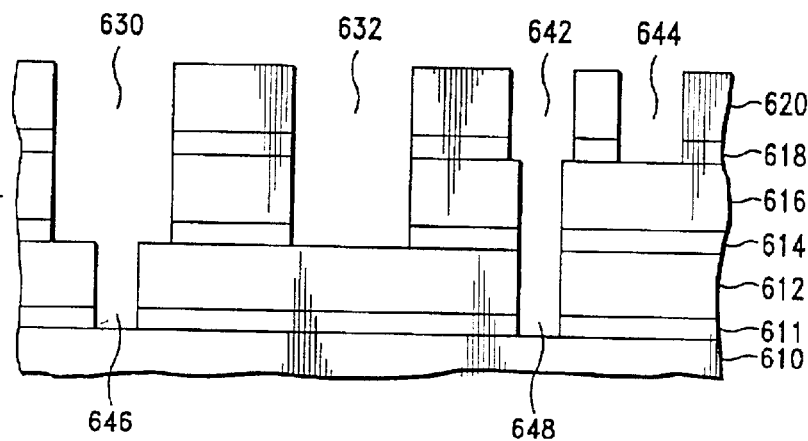
FIGS. 6A and 6B are schematic cross-sectional side views illustrating another embodiment of IC structures of the present invention at sequential stages.
Figure 6B:
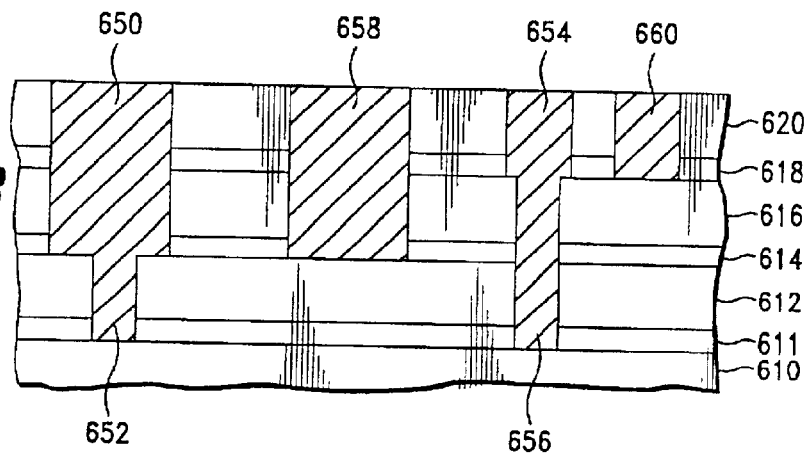

The inventive techniques described in connection with FIGS. 4A–4F and 5A–5D can be utilized in another embodiment of the present invention to form a novel quadruple damascene structure, as shown in FIGS. 6A and 6B. A cap layer 611 (FIG. 6A) is deposited on a substrate, such as a semiconductor substrate 610. A first dielectric layer 612, a second (etch stop) dielectric layer 614, a third dielectric layer 616, a fourth (etch stop) dielectric layer 618 and a fifth dielectric layer 620 are subsequently deposited. Anisotropic etching processes are used to etch a power line trench 630 having an underlying via hole 646, a power line trench 632, a signal line trench 642 having an underlying via hole 648, and an additional signal line trench 644.

The via holes and trenches (FIG. 6A) are simultaneously filled with an electrically conductive material. Excess conductive material is then removed from the surface of fifth dielectric layer 620, resulting in the inventive structure depicted in FIG. 6B. A novel quadruple damascene structure is thereby fabricated. This quadruple damascene structure includes a power line 650 with an underlying via plug 652 contacting substrate 610, and a signal line 654 with an underlying via plug 656 contacting substrate 610. An additional power line 658 and an additional signal line 660 can be fabricated simultaneously with the quadruple damascene structure. This quadruple damascene structure uses four design rules as shown in Table D with reference to FIG. 6B.

TABLE D

| Design Rule | Cap Layer or Dielectric Layer |
| --- | --- |
| Power line (650) | second (614), third (616), fourth (618) and fifth (620) |
| Power line via plug (652) | cap (611) and first (612) |
| Signal line (654) | fourth (618) and fifth (620) |
| Signal line via plug (656) | cap (611), first (612), second (614) and third (616) |

Another embodiment of the present invention is illustrated in FIGS. 7A–7F. A first dielectric layer 712 is deposited on a substrate, such as a semiconductor substrate 710. A second dielectric layer 714 is deposited on layer 712, followed by the deposition of a third dielectric layer 716 on layer 714. A first photoresist layer 718 is deposited on layer 716. This photoresist has a power line trench pattern 720 and a via pattern 722. Layers 712 and 716 have similar etching characteristics while the etching characteristics of layer 714 are dissimilar from those of layers 712 and 716. The dielectric and photoresist layers shown in FIGS. 7A–7F can be deposited by any of the methods which are well known to those of ordinary skill in the art.

Figure 7A:
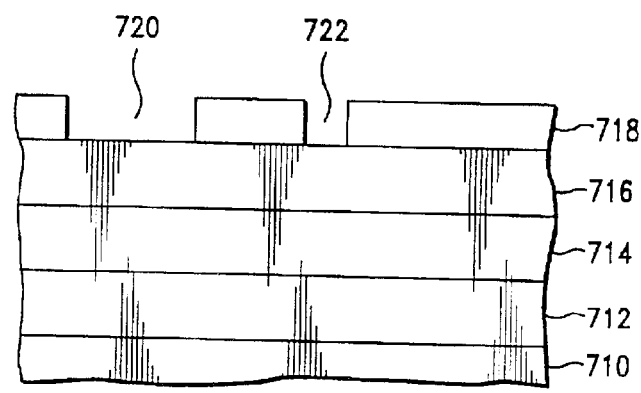
FIGS. 7A–7F are schematic cross-sectional side views illustrating another embodiment of IC structures of the present invention at sequential stages.
Figure 7B:
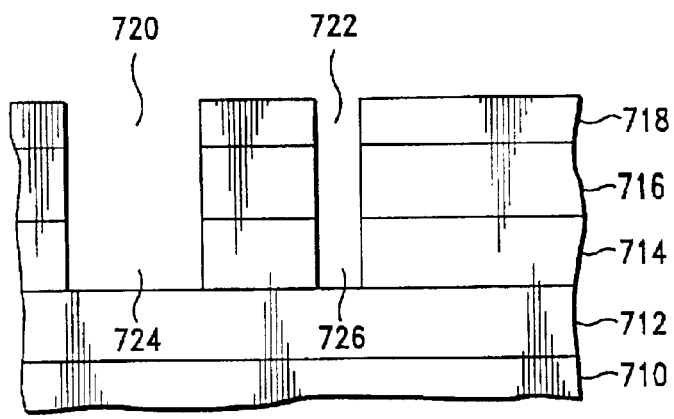
Figure 7C:
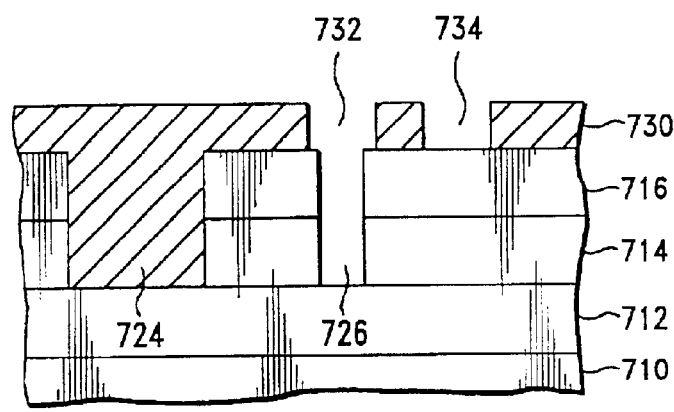
Figure 7D:
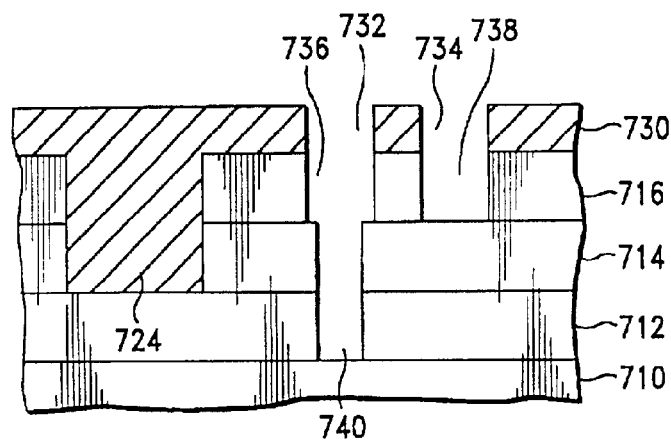
Figure 7E:
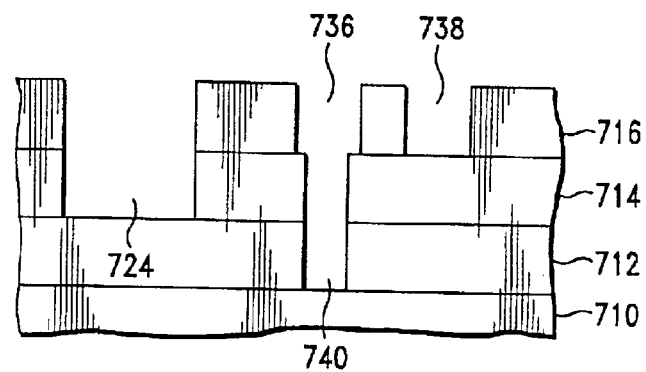

As depicted in FIG. 7B, power line trench pattern 720 and via pattern 722 are anisotropically etched through layers 716 and 714. This etching procedure requires different etch chemistries for layers 716 and 714 because these layers have dissimilar etching characteristics. The etching procedure results in power line trench 724 and via hole 726. First resist layer 718 is stripped and a second resist layer 730 (FIG. 7C) is deposited on the surface of layer 716 and inside power line trench 724. Resist layer 730 is patterned for a first signal line trench overlaying via hole 726 and an additional signal line trench 734. A subsequent anisotropic etch procedure is employed to etch signal line trenches 736 (FIG. 7D) and 738 through third dielectric layer 716. Simultaneously, the via pattern is anisotropically etched through first dielectric layer 712, thereby forming via hole 740 which extends to substrate 710. Layer 714 is an etch mask for etching via hole 740. Second photoresist 730 is stripped from the surface of layer 716 and from trench 724, see FIG. 7E. The etch chemistries which are used to etch the trenches and via holes of this embodiment of the invention need to be selective to first and second photoresist layers 718 and 730 respectively.

Figure 7F:
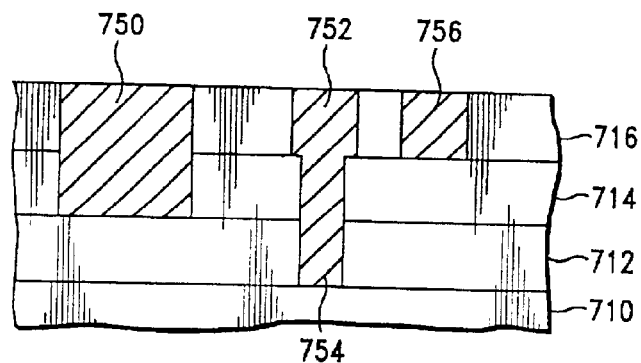

Power line trench 724, via hole 740 and signal line trenches 736 and 738 are simultaneously filled with a conductive material, such as a metal. Excess metal is removed from layer 716, using for example conventional CMP or conventional etch back to define the interconnect lines as shown in FIG. 7F. A novel triple damascene structure is thereby fabricated, including a power line 750 and a signal line 752 having an underlying via plug 754 which contacts substrate 710. An additional signal line 756 can be fabricated simultaneously with the triple damascene structure, as shown in FIG. 7F. This triple damascene structure employs three design rules as shown in Table E with reference to FIG. 7F.

TABLE E

| Design Rule | Dielectric Layer |
| --- | --- |
| Power line (750) | second (714) and third (716) |
| Signal line (752) | third (716) |
| Via plug (754) | first (712) and second (714) |

In summary, formation of the fabricated structures illustrated in FIGS. 7A–7F includes two etching sequences as follows. A first etching sequence comprising: depositing a first etch mask layer, such as a photoresist, on the third dielectric layer, developing a power line trench pattern and a via pattern in the first mask layer, simultaneously etching the power line trench pattern and the via pattern through the third and second dielectric layers, and removing the first etch mask layer. A second etching sequence including: depositing a second etch mask while simultaneously etching the signal line trench pattern through the third dielectric layer.

The inventive techniques of the present embodiment are suitable for a variety of dielectric stacks, providing that the etch selectivity and etching characteristics of the materials meet the criteria which are described in connection with FIGS. 7A–7F. Examples of suitable dielectric stack materials for second dielectric layer 714 include oxides such as PECVD $SiO_2$ and F—$SiO_2$, while suitable dielectric materials for first and third dielectric layers 712 and 716 include materials having a low dielectric constant, such as polymers, for example amorphous fluorinated carbon based materials, spin-on dielectric polymers such as fluorinated and non-fluorinated poly(arylene) ethers (commercially known as FLARE 1.0 and 2.0, which are available from Allied Signal Company), poly(arylene) ethers (commercially known as PAE 2-3, available from Schumacher Company), divinyl siloxane benzocyclobutane (DVS-BCB) or similar products and aero-gel. These dielectric materials are well known to those of ordinary skill in the art. The oxides and the polymers have dissimilar etching characteristics because etch chemistries used for polymer etching, such as $O_2$-based etch chemistries, are highly selective with respect to $SiO_2$. On the other hand, $CHF_x$-based chemistry typically used for etching $SiO_2$ is highly selective with respect to polymer.

Another example of a suitable dielectric stack for the structures shown in FIGS. 7A–7F includes second dielectric layer 714 dielectric materials comprising nitride, such as CVD silicon nitride, while dielectric materials for first and third dielectric layers 712 and 716 include oxides, such as PECVD $SiO_2$ and F—$SiO_2$. Other suitable materials for the dielectric stack include second dielectric layer 714 low k materials, such as polymers, while employing first and third dielectric layers 712 and 716 comprising one or more oxides such as PECVD $SiO_2$ and F—$SiO_2$.

In still another embodiment of the present invention quadruple damascene structures are fabricated as illustrated in FIGS. 8A–8D. Substrate 810 (FIG. 8A) and first, second and third dielectric layers 812, 814 and 816 are similar to the corresponding layers of FIG. 7A. Power line trenches 822 and 824, and via hole 826 are formed in the structure shown in FIG. 8A using techniques similar to those described to form power line trench 724 and via hole 726 depicted in FIG. 7B. A photoresist layer 820 (see FIG. 8A) is deposited on layer 816 and in power line trenches 822 and 824. A via pattern 828 is developed in resist 820 inside power line trench 822. Also, a signal line trench pattern 830 is developed in resist 820 overlaying via hole 826. An additional signal line trench pattern 832 is provided in resist 820 on third dielectric layer 816.

Figure 8A:
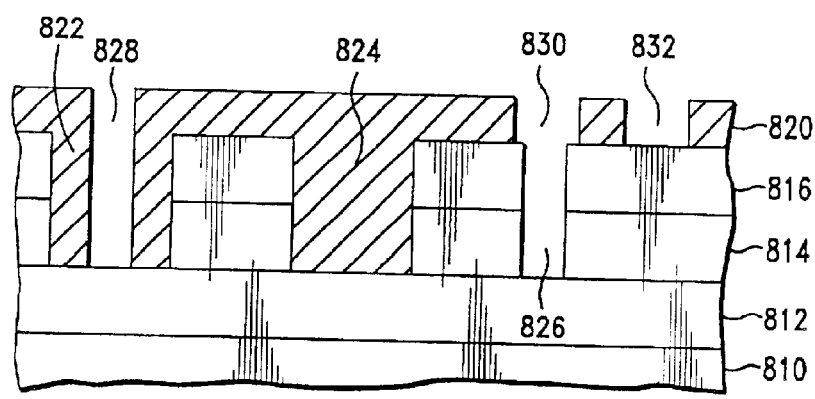
FIGS. 8A–8D are schematic cross-sectional side views illustrating another embodiment of IC structures of the present invention at sequential stages.
Figure 8B:
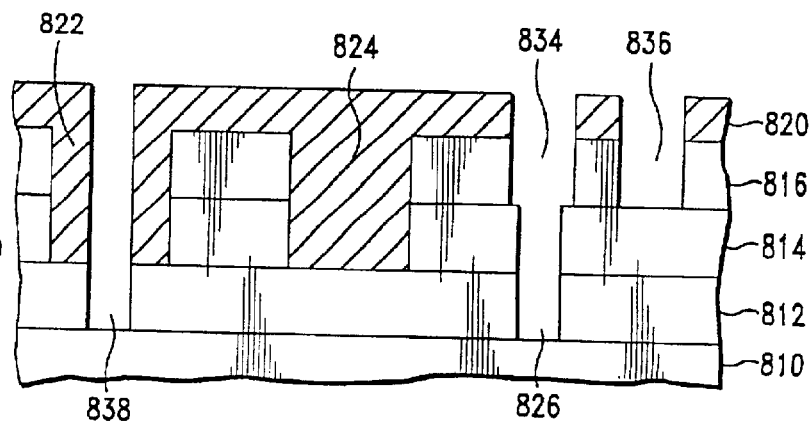
Figure 8C:
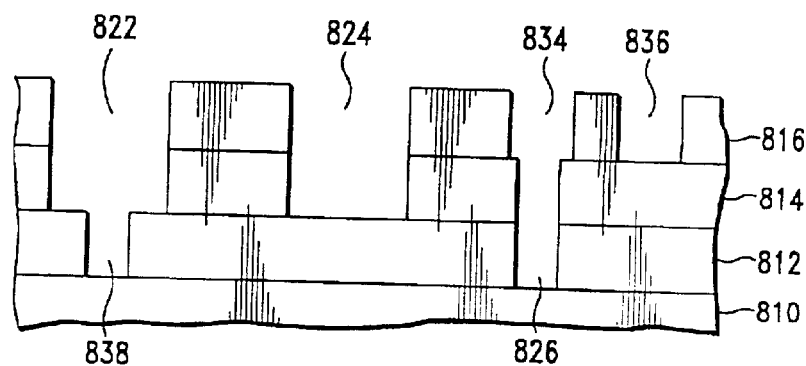
Figure 8D:
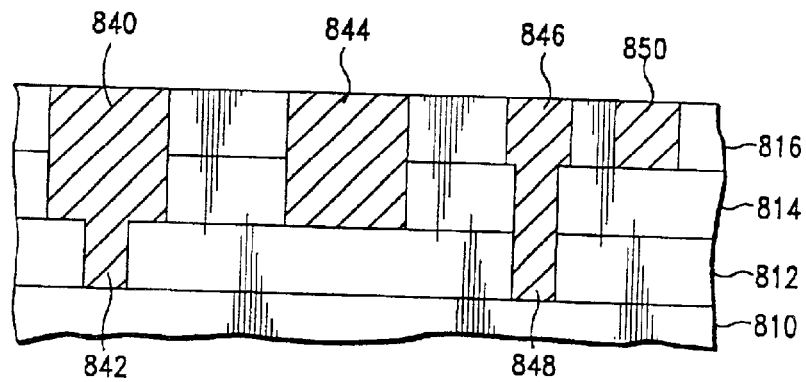

As shown in FIG. 8B, an anisotropic etching procedure is used to simultaneously etch signal line trenches 834 and 836 through third dielectric layer 816, and via holes 838 and 826 through first dielectric layer 812. Resist 820 is subsequently stripped, resulting in the structure shown in FIG. 8C which includes power line trench 822 with underlying via hole 838, power line trench 824, signal line trench 834 with underlying via hole 826, and signal line trench 836. Via holes 826 and 838 extend to substrate 810. These trenches and via holes are simultaneously filled with a conductive material, such as a metal. Excess conductive material is removed from the surface of layer 816, using for example conventional CMP or conventional etch back techniques, thereby fabricating the inventive structure depicted in FIG. 8D. A novel quadruple damascene structure is formed using four design rules, including a power line 840 having an underlying via plug 842 and a signal line 846 with an underlying via plug 848. An additional power line 844 and an additional signal line 850 can be fabricated simultaneously with the quadruple damascene structure. The four design rules for this quadruple damascene structure are shown in Table F with reference to FIG. 8D.

TABLE F

| Design Rule | Dielectric Layer |
| --- | --- |
| Power line (840) | second (814) and third (816) |
| Power line via plug (842) | first (812) |
| Signal line (846) | third (816) |
| Signal line via plug (848) | first (812) and second (814) |

Figure 9A:
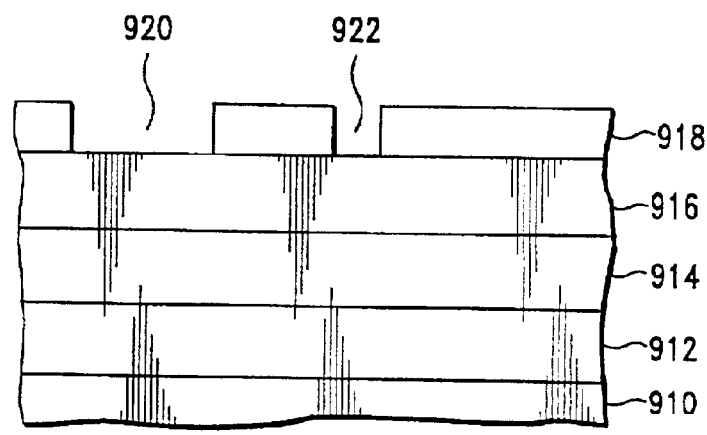
FIGS. 9A–9F are schematic cross-sectional side views illustrating another embodiment of IC structures of the present invention at sequential stages.
Figure 9B:
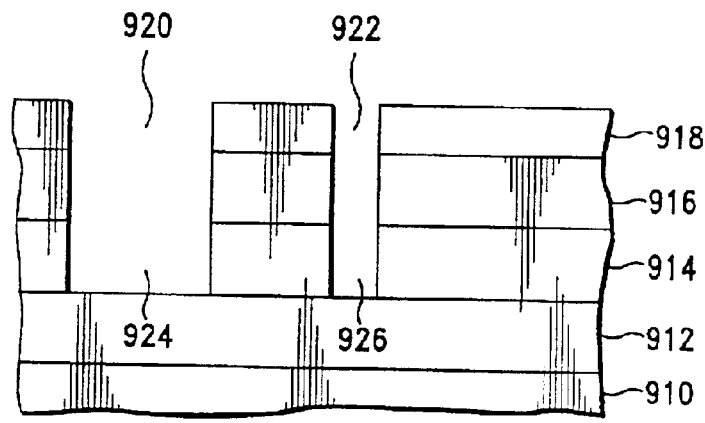
Figure 9C:
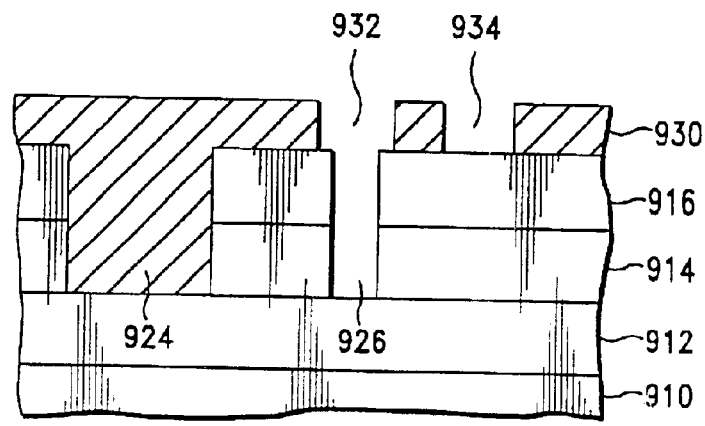

FIGS. 9A–9F illustrate an additional embodiment of the present invention wherein timed etches are used to fabricate triple damascene structures. FIG. 9A depicts a structure, such as an IC structure, having a first dielectric layer 912 deposited on a substrate, such as a semiconductor substrate 910. A second dielectric layer 914 is deposited on layer 912. This is followed by the deposition of a third dielectric layer 916. The present embodiment employs dielectric layers having similar etching characteristics. Alternatively, dielectric layers 912, 914 and 916 can comprise the same dielectric material for each of the three layers. A first photoresist layer 918 is deposited on third dielectric layer 916. The dielectric and photoresist layers depicted in FIG. 9A can be deposited by any of the methods which are well known to those of ordinary skill in the art.

Figure 9D:
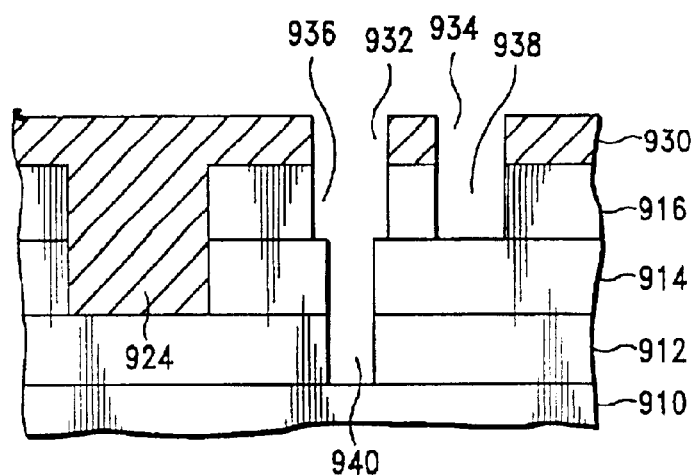
Figure 9E:
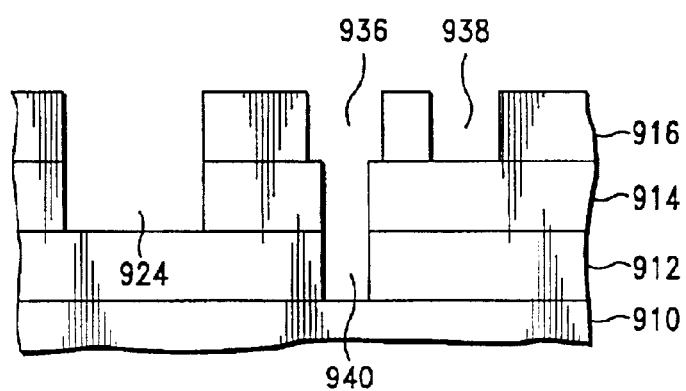
Figure 9F:
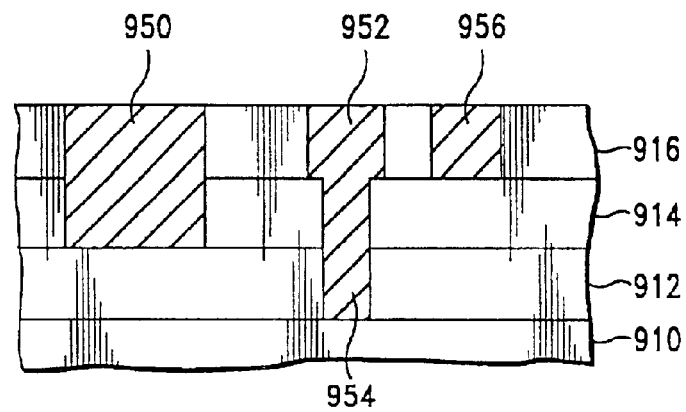

As illustrated in FIG. 9A, power line trench mask 920 and via mask 922 are developed in first resist layer 918. A timed anisotropic etch is subsequently used to form power line trench 924 (FIG. 9B) in layers 914 and 916 and to simultaneously etch the via pattern through layers 914 and 916, forming via hole 926. First photoresist 918 is then stripped and a second photoresist 930 (FIG. 9C) is deposited on layer 916 and in power line trench 924. Signal line trench patterns 932 and 934 are formed in second photoresist layer 930 on dielectric layer 916, wherein pattern 932 overlays via hole 926. Another timed anisotropic etch is utilized, as illustrated in FIG. 9D, to etch signal line trenches 936 and 938 through layer 914, and to simultaneously etch via hole 926 through layer 912, forming via hole 940. Second photoresist 930 is stripped, resulting in the structure depicted in FIG. 9E which includes power line trench 924, signal line trench 936 with underlying via hole 940, and signal line trench 938. The via hole and trenches depicted in FIG. 9E are simultaneously filled with an electrically conductive material, such as a metal. Excess conductive material is removed from the surface of layer 916 using any of the methods which are well known to those skilled in the art, thus forming the inventive structure, such as an IC structure, shown in FIG. 9F. A novel triple damascene structure using three design rules is formed by a power line 950 and a signal line 952 having an underlying via plug 954. The structure shown in FIG. 9F also depicts a signal line 956 which can be fabricated simultaneously with the triple damascene structure. This triple damascene structure employs three design rules extending through various dielectric layers of the structure as shown in Table G with reference to FIG. 9F.

TABLE G

| Design Rule | Dielectric Layer |
| --- | --- |
| Power line (950) | second (914) and third (916) |
| Signal line trench (952) | third (916) |
| Via plug (954) | first (912) and second (914) |

The inventive techniques of the present embodiment shown in FIGS. 9A–9F, are suitable for a variety of dielectric stacks, providing that the dielectric layers have similar timed etching characteristics. Examples of suitable dielectric stack materials for first, second and third dielectric layers 914, 914 and 916 include oxides such as PECVD $SiO_2$ and F—$SiO_2$. Other examples for a suitable dielectric stack include materials having a low dielectric constant, such as polymers, for example amorphous fluorinated carbon based materials, spin-on dielectric polymers such as fluorinated and non-fluorinated poly(arylene) ethers (commercially known as FLARE 1.0 and 2.0, which are available from Allied Signal Company), poly(arylene) ethers (commercially known as PAE 2-3, available from Schumacher Company), divinyl siloxane benzocyclobutane (DVS-BCB) or similar products and aero-gel. These dielectric materials are well known to those of ordinary skill in the art. It will be understood that the etch chemistries for the timed etching of the dielectric stack need to be selective to first and second photoresists 918 and 930.

Figure 10A:
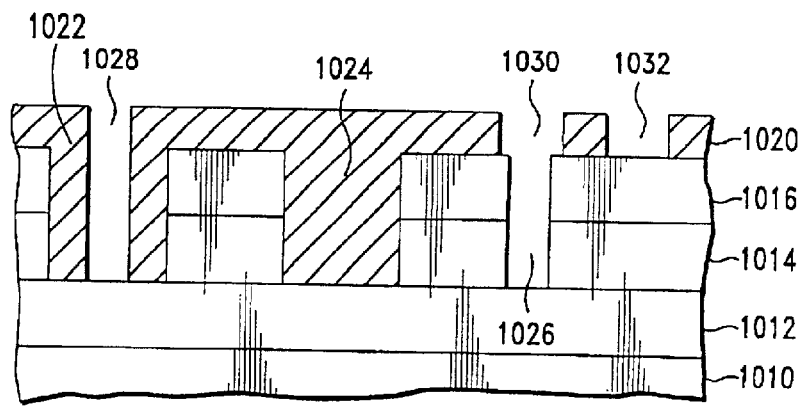
FIGS. 10A–10D are schematic cross-sectional side views illustrating another embodiment of IC structures of the present invention at sequential stages.

In another embodiment of the present invention quadruple damascene structures are fabricated utilizing dielectric stacks and fabrication techniques similar to those described in connection with FIGS. 9A–9F. Fabrication of the quadruple damascene structures of the present embodiment is illustrated in FIGS. 10A–10D. FIG. 10A shows a structure, such as an IC structure, having a substrate 1010, such as a semiconductor substrate, upon which a first dielectric layer 1012 is deposited. Power line trenches 1022 and 1024 and via hole 1026 are formed in the structure shown in FIG. 10A using timed anisotropic etching techniques similar to those described to form power line trench 924 and via hole 926 depicted in FIG. 9B. A photoresist layer 1020 (FIG. 10A) is deposited on dielectric layer 1016 and inside power line trenches 1022 and 1024. A via pattern 1028 is developed in resist 1020 inside power line trench 1022. A signal line trench pattern 1030 is developed in resist 1020 overlaying via hole 1026. It will be understood that development of pattern 1030 results in stripping resist 1020 which may have been deposited in via hole 1026. An additional signal line trench pattern 1032 is developed in resist 1020 on dielectric layer 1016.

Figure 10B:
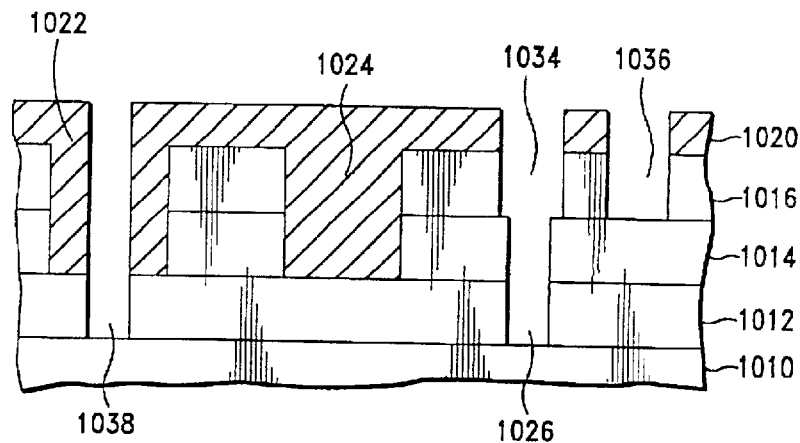
Figure 10C:
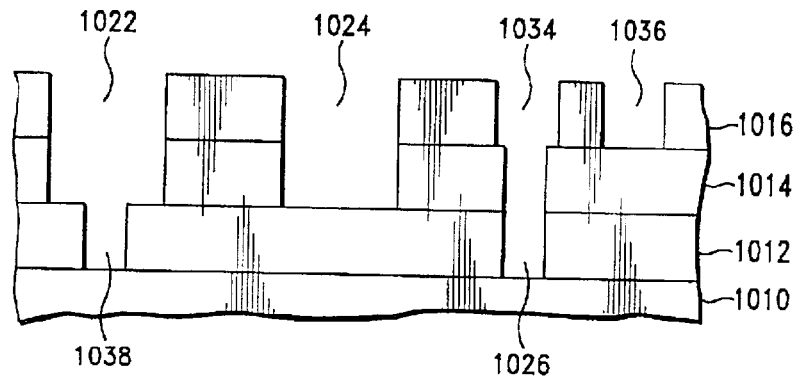
Figure 10D:
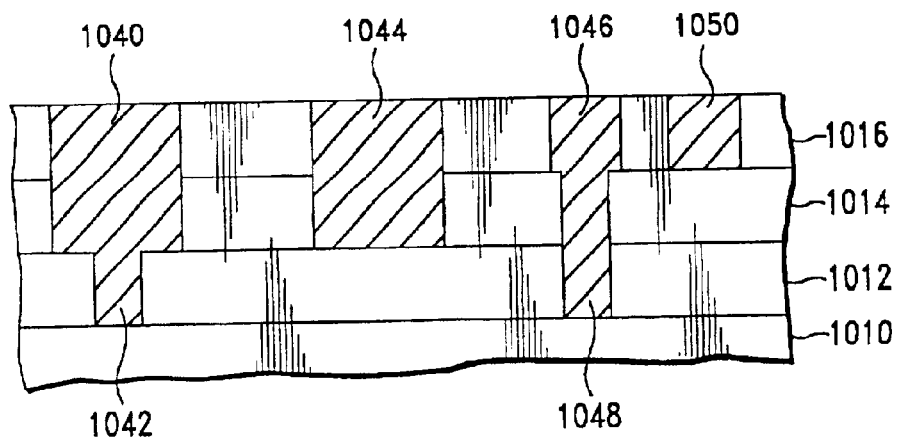

As depicted in FIG. 10B a timed anisotropic etching procedure is employed to simultaneously etch signal line trenches 1034 and 1036, and via holes 1026 and 1038. Via holes 1026 and 1038 extend to substrate 1010. Resist 1020 is then stripped, resulting in the structure shown in FIG. 10C which includes power line trench 1022 with underlying via hole 1038, power line trench 1024, signal line trench 1034 with underlying via hole 1026 and signal line trench 1036. These trenches and via holes are simultaneously filled with a conductive material, such as a metal. Excess conductive material is removed from the surface of third dielectric layer 1016, using for example conventional CMP or conventional etch back techniques, as shown in FIG. 10D. A novel quadruple damascene structure is formed using four design rules, including a power line 1040 having an underlying via plug 1042 and a signal line 1046 with an underlying via plug 1048. An additional power line 1044 and signal line 1050 can be fabricated simultaneously with the quadruple damascene structure. The four design rules for the quadruple damascene structure of the present embodiment are shown in Table H with reference to FIG. 10D.

TABLE H

| Design Rule | Dielectric Layer |
| --- | --- |
| Power line (1040) | second (1014) and third (1016) |
| Power line via plug (1042) | first (1012) |
| Signal line (1046) | third (1016) |
| Signal line via plug (1048) | first (1012) and second (1014) |

The novel quadruple damascene structures illustrated in FIGS. 4F, 6B, 8D and 10D show two via plugs which contact the respective substrates. It will be understood that the two via plugs of each of these structures can contact the same element of a substrate or different elements of that substrate.

Additional embodiments (not shown) of the present invention include depositing a liner inside the via holes and trenches of the IC structures shown in FIGS. 3E, 4E, 5C, 6A, 7E, 8C, 9E and 10C. The lined via holes and trenches are then simultaneously filled with a conductive material to form the triple and quadruple damascene structures of the present invention. Suitable liner materials include adhesion promoters and diffusion barrier materials. For example suitable liner materials for Cu or Cu alloy containing damascene structures of the present invention include CVD (chemical vapor deposition) or PVD (physical vapor deposition) TiN, WN, Ta and TaN. Examples of suitable liner materials for Al, Al alloy, W, or W alloy containing damascene structures include PVD Ti/TiN.

Suitable semiconductor materials for use in semiconductor substrates of the present invention include silicon, germanium, silicon/germanium alloys, gallium arsenide and indium/gallium/arsenide/phosphide. Typically, triple and quadruple damascene structures of the present invention contact a metallized line of the semiconductor substrate. Suitable conductive materials for filling the damascene trenches and via holes of the present invention include metals such as Cu, Ag, Al, W, their alloys and mixtures of these metals with or without alloys. While the embodiments of the invention are described and illustrated using metal interconnect lines and metal damascene structures, the invention is equally operable when conductive materials other than metals are used. Suitable conductive materials include metallic and nonmetallic superconductors, i.e. materials having zero direct current resistance at or below their superconducting transition temperature, such as metallic nickel/germanium and nonmetallic yttrium/barrier/copper oxides. Suitable techniques for simultaneously filling damascene trenches and via holes include CVD, PVD, electroplating and electroless plating. These techniques are well known to those of ordinary skill in the art.

The inventive techniques which are described in connection with FIGS. 3A–10D utilize photoresist masks. However, it will be understood that the invention is equally operable when hard masks or combinations of photoresist masks and hard masks are used providing that the mask material has a low etch rate for the etching procedures used in etching the dielectric layers of the inventive structures. The various etching techniques and etching chemistries employed in the embodiments of the present invention include techniques and chemistries which are well known to those of ordinary skill in the art. Also, it will be understood that it is necessary to clean or prepare the surface of the structure prior to the deposition of any layer in any subsequent fabrication step, using surface preparation methods and materials which are well known to those of ordinary skill in the art. It will also be understood that methods for removing resist include conventional dry and wet methods.

Figures 11, 12:
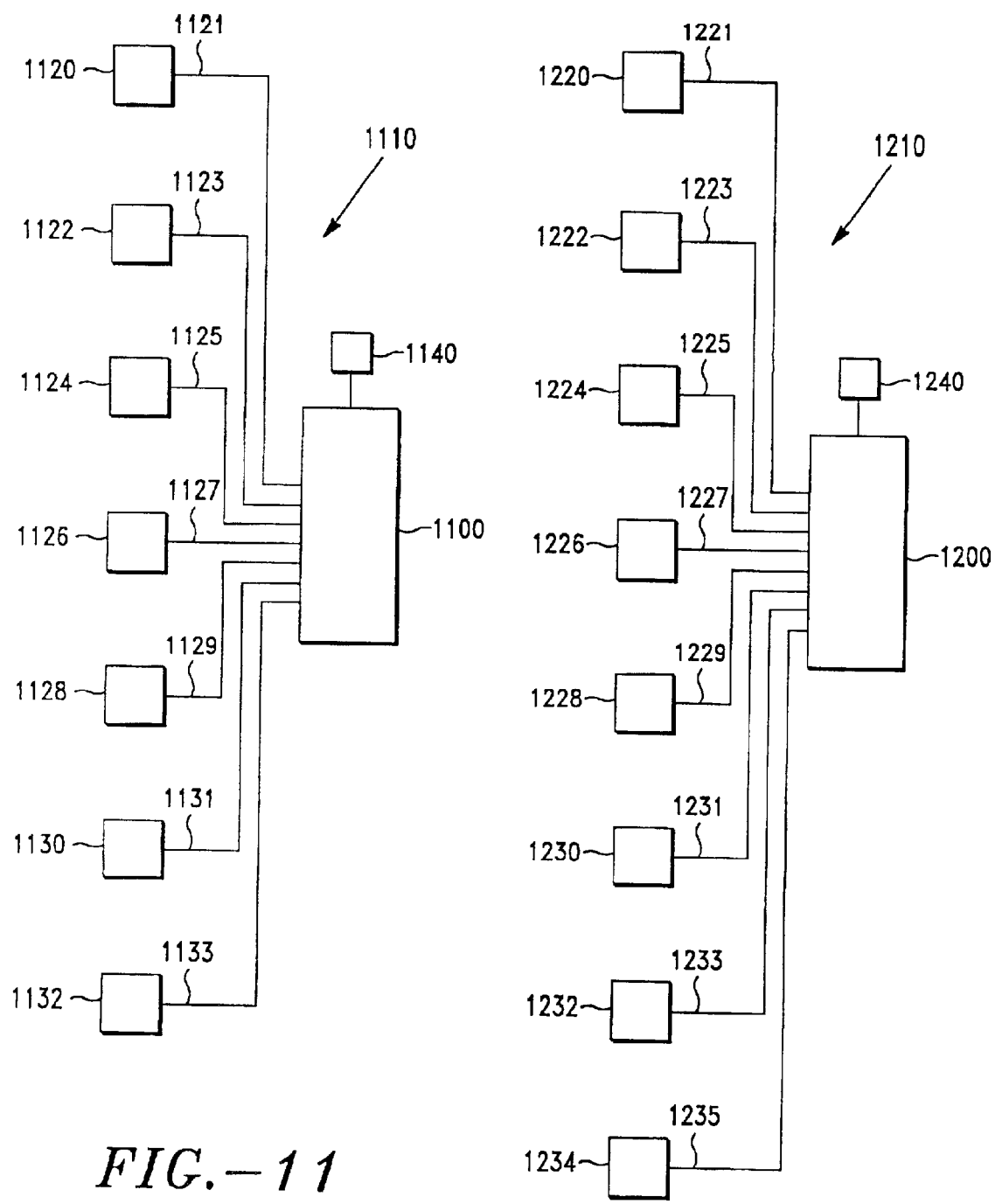
FIG. 11 is a block diagram illustrating a manufacturing system for fabricating the IC structures of FIGS. 3A–3G.
FIG. 12 is a block diagram illustrating a manufacturing system for fabricating the IC structures of FIGS. 5A–5D.

The novel triple and quadruple damascene fabrication techniques of the present invention require a sequence of processing steps. Each processing step can be performed at a fabrication station. All or some of the fabrication stations and their respective processing steps can be integrated by means of a novel apparatus including a controller 1100 illustrated in FIG. 11. Controller 1100 is adapted for controlling a number of fabrication stations which are utilized in the formation of fabricated structures, such as the IC structures described in connection with FIGS. 3A–3G. As illustrated in FIG. 11, a novel manufacturing system 1110 for fabricating IC structures includes controller 1100 and a plurality of fabrication stations: 1120, 1122, 1124, 1126, 1128, 1130 and 1132. Additionally, system 1110 has operative links 1121, 1123, 1125, 1127, 1129, 1131 and 1133 which provide connections between controller 1100 and fabrication stations 1120, 1122, 1124, 1126, 1128, 1130 and 1132 respectively. The novel apparatus includes a data structure such as a computer program which causes controller 1100 to control the processing steps at each of the fabrication stations and to, optionally, regulate the sequence in which fabrication stations are used in order to form the novel structures.

Examples of suitable controllers include conventional computers and computer systems including one or more computers which are operably connected to other computers or to a network of computers or data processing devices. Suitable computers include computers commonly known as personal computers. The data structure which is used by controller 1100 can be stored on a removable electronic data storage medium 1140 (FIG. 11), such as computer floppy disks, removable computer hard disks, magnetic tapes and optical disks, to facilitate the use of the same data structure at different manufacturing locations. Alternatively, the data structure can be stored on a non-removable electronic data storage medium, including a medium positioned at a location which is remote (not shown) from controller 1100, using such data storage devices as are well known to those or ordinary skill in the art. The data structure can be communicated from a remote location to controller 1100 using communicating techniques which are well known to those of ordinary skill in the art including hard wire connections, wireless connections and data communication methods utilizing one or more modems or techniques using one or more computers commonly known as servers. The data storage medium can be operably connected to the controller using methods and device components which are well known to those of ordinary skill in the art. Examples of suitable fabrication stations for manufacturing system 1110 include the stations shown in Table I.

TABLE I

| Station | Processing Step |
|---|---|
| 1120 | depositing a first dielectric layer on a substrate |
| 1122 | depositing a second dielectric layer on the first dielectric layer |
| 1124 | depositing a third dielectric layer on the second dielectric layer |
| 1126 | depositing a fourth dielectric layer on the third dielectric layer |
| 1128 | depositing a fifth dielectric layer on the fourth dielectric layer |
| 1130 | simultaneously anisotropically etching a power line trench pattern and a via pattern through the fifth, fourth and third dielectric layers |
| 1132 | anisotropically etching a signal line trench pattern through the fifth dielectric layer and anisotropically etching the via pattern through the second and first dielectric layers |

Additional fabrication stations can be added to manufacturing system 1110, for example one or more planarizing stations. The sequence of processing steps shown in Table I is illustrative of system 1110. However, the invention is equally operable in systems wherein a controller, such as controller 1100, causes the sequence to be altered, for example by repeating a previously executed processing step if test results indicate that this processing step should be partly or completely repeated. Alternatively, the process sequence which is controlled by a controller such as controller 1100, can include processing steps such as surface preparation which may be performed following any of the fabrication stations shown in FIG. 11 and Table I. It is also contemplated that one or more fabrication stations can be positioned at a location which is remote from the other fabrication stations in which case an additional controller or a network of controllers can be employed to control the remotely located manufacturing station.

As illustrated in FIG. 11, controller 1100 is adapted to be connected to each of the manufacturing stations through operative links. Each of these links provides a bidirectional connection enabling controller 1100 to transfer commands from its data structure, such as specific operating parameters, and to receive information, such as test data, from the fabrication station. The operative links can be in the form of hard wire connections or wireless connections.

FIG. 12 depicts another embodiment of the present invention. A novel apparatus including inventive controller 1200 is adapted for controlling fabrication stations which are utilized in the formation of fabricated structures, such as IC structures described in connection with FIGS. 5A–5D. Fabrication stations 1220, 1222, 1224, 1226, 1228, 1230, 1232 and 1234 are connected to controller 1200 through operative links 1221, 1223, 1225, 1227, 1229, 1231, 1233 and 1235 respectively. The novel apparatus includes a data structure which causes the controller to control the processing steps at each of the fabrication stations. A novel manufacturing system 1210 for manufacturing the structures illustrated in FIGS. 5A–5D includes controller 1200, the data structure, the above manufacturing stations and the operative links.

The data structure can be provided on a removable electronic storage medium 1240. The controller, the data structure, the operative links and the removable storage medium are similar to those described in connection with FIG. 11. Examples of suitable fabrication stations for manufacturing system 1210 include the stations shown in Table J.

TABLE J

| Station | Processing Step |
|---|---|
| 1220 | depositing a cap layer on a substrate |
| 1222 | depositing a first dielectric layer on the cap layer |
| 1224 | depositing a second dielectric layer on the first dielectric layer |
| 1226 | depositing a third dielectric layer on the second dielectric layer |
| 1228 | depositing a fourth dielectric layer on the third dielectric layer |
| 1230 | depositing a fifth dielectric layer on the fourth dielectric layer |
| 1232 | simultaneously anisotropically etching a power line trench pattern and a via pattern though the fifth, fourth and third dielectric layers |
| 1234 | anisotropically etching a signal line trench pattern though the fifth and fourth dielectric layers, anisotropically etching the power line trench pattern through the second dielectric layer and anisotropically etching the via pattern through the second and first dielectric layers and though the cap layer. |

Figure 13:
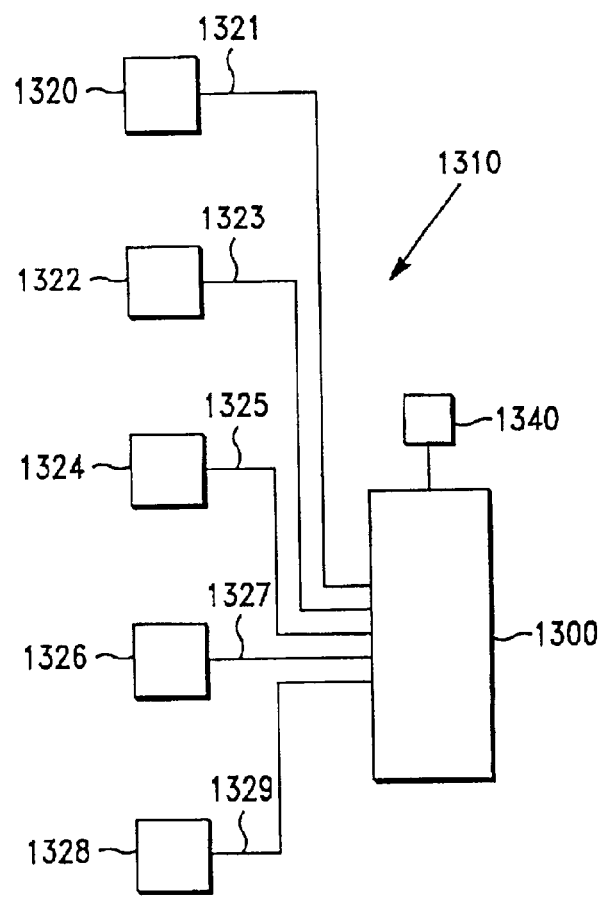
FIG. 13 is a block diagram illustrating a manufacturing system for fabricating the IC structures of FIGS. 7A–7F and 9A–9F.

FIG. 13 depicts another embodiment of the present invention. A novel apparatus including inventive controller 1300 is adapted for controlling fabrication stations which are utilized in the formation of fabricated structures, such as IC structures described in connection with FIGS. 7A–7F and 9A–9F. Fabrication stations 1320, 1322, 1324, 1326 and 1328 are connected to controller 1300 through operative links 1321, 1323, 1325, 1327 and 1329 respectively. The novel apparatus includes a data structure which causes the controller to control the processing steps at each of the fabrication stations. A novel manufacturing system 1310 for manufacturing the structures illustrated in FIGS. 7A–7F and 9A–9F includes controller 1300, the data structure, the above manufacturing stations and the operative links. The data structure can be provided on a removable electronic storage medium 1340. The controller, the data structure, the operative links and the removable storage medium are similar to those described in connection with FIG. 11. Examples of suitable fabrication stations for manufacturing system 1310 include the stations shown in Table K.

TABLE K

| Station | Processing Step |
|---|---|
| 1320 | depositing a first dielectric layer on a substrate |
| 1322 | depositing a second dielectric layer on the first dielectric layer |
| 1324 | depositing a third dielectric layer on the second dielectric layer |
| 1326 | simultaneously anisotropically etching a power line trench pattern and a via pattern through the third and second dielectric layers |
| 1328 | simultaneously anisotropically etching a signal line trench pattern through the third dielectric layer and the via pattern through the first dielectric layer |

The invention has been described in terms of the preferred embodiment. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

I claim:

1. A device comprising:

a) a substrate;

b) a first dielectric layer positioned on the substrate;

c) a second dielectric layer positioned on the first dielectric layer, wherein the first and second dielectric layers have dissimilar etching characteristics.

d) a third dielectric layer positioned on the second dielectric layer;

e) a fourth dielectric layer positioned on the third dielectric layer, wherein the first and fourth dielectric layers have dissimilar etching characteristics;

f) a fifth dielectric layer positioned on the fourth dielectric layer, wherein the fifth dielectric layer has dissimilar etching characteristics with regard to the second and the fourth dielectric layers, and wherein the first and fifth dielectric layers have similar etching characteristics;

g) a first region in the fifth dielectric layer defining a power line trench extending through the fifth, fourth and third dielectric layers;

h) a second region in the fifth dielectric layer defining a signal line trench extending through the fifth dielectric layer; and i) a third region in the fourth dielectric layer underlying the signal line trench, defining a first via hole extending through the fourth, third, second and first dielectric layers, wherein the power line trench, the signal line trench and the first via hole are adapted for containing a triple damascene structure.

2. The device of claim 1 wherein (1) the first, third and fifth dielectric layers comprise one or more dielectric materials selected from the group consisting of amorphous fluorinated carbon, organic spin-on materials, spin-on-glass, aero-gel, poly(arylene)ethers, fluorinated poly(arylene) ethers and divinyl siloxane benzo-cyclobutane and (2) the second and fourth dielectric layers comprise one or more dielectric materials selected from the group consisting of $SiO_2$ and fluorinated $SiO_2$.

3. The device of claim 1 wherein (1) the first, third and fifth dielectric layers comprise one or more dielectric materials selected from the group consisting of $SiO_2$ and fluorinated $SiO_2$ and (2) the second and fourth dielectric layers comprise one or more dielectric materials selected from the group consisting of amorphous fluorinated carbon, organic spin-on materials, spin-on-glass, aero-gel, poly(arylene) ethers, fluorinated poly(arylene)ethers and divinyl siloxane benzocyclobutane.

4. The device of claim 1 additionally comprising a conductive material positioned in the power line trench, the signal line trench and the first via hole, thereby forming a power line, a signal line and a first via plug.

5. The device of claim 4 wherein the power line comprises a substantially greater thickness than the signal line.

6. The device of claim 1 additionally comprising a fourth region in the second dielectric layer underlying the power line trench, defining a second via hole extending through the second and first dielectric layers, wherein the power line trench, the signal trench, the first via hole and the second via hole are adapted for containing a quadruple damascene structure.

7. The device of claim 6 additionally comprising a conductive material positioned in the power line trench, the signal trench, the first via hole and the second via hole.

8. A device comprising:
a) a substrate;
b) a cap layer positioned on the substrate;
c) a first dielectric layer positioned on the cap layer;
d) a second dielectric layer positioned on the first dielectric layer, wherein the first and second dielectric layers have dissimilar etching characteristics;
e) a third dielectric layer positioned on the second dielectric layer,
f) a fourth dielectric layer positioned on the third dielectric layer, wherein (1) the first and fourth dielectric layers have dissimilar etching characteristics and (2) the cap layer and the second and fourth dielectric layers have similar etching characteristics;
g) a fifth dielectric layer positioned on the fourth dielectric layer, wherein (1) the fifth dielectric layer has dissimilar etching characteristics with regard to the cap layer and the second and fourth dielectric layers and (2) the first and fifth dielectric layers have similar etching characteristics;
h) a first region in the fifth dielectric layer defining a power line trench extending through the fifth, fourth, third and second dielectric layers;
i) a second region in the fifth dielectric layer defining a signal line trench extending through the fifth and fourth dielectric layers; and
j) a third region in the third dielectric layer and underlying the signal trench line, defining a first via hole extending from the third dielectric layer to the substrate, wherein the power line trench, the signal line trench and the first via hole are adapted for containing a triple damascene structure.

9. The device of claim 8 additionally comprising a conductive material positioned in the power line trench, the signal line trench and the first via hole, thereby forming a power line, a signal line and a first via plug.

10. The device of claim 9 wherein the power line comprises a substantially greater thickness than the signal line.

11. The device of claim 8 additionally comprising a fourth region in the first dielectric layer and underlying the power line trench, defining a second via hole extending from the power line trench to the substrate, wherein the power line trench, the signal line trench, the first via hole and the second via hole are adapted for containing a quadruple damascene structure.

12. The device of claim 11 additionally comprising a conductive material positioned in the power line trench, the signal line trench, the first via hole and the second via hole.

13. A device comprising:
a) a substrate;
b) a first dielectric layer positioned on the substrate;
c) a second dielectric layer positioned on the first dielectric layer, wherein the first and second dielectric layers have dissimilar etching characteristics;
d) a third dielectric layer positioned on the second dielectric layer, wherein (1) the second and third dielectric layers have dissimilar etching characteristics and (2) the first and third dielectric layers have similar etching characteristics;
e) a first region in the third dielectric layer defining a power line trench extending through the third and second dielectric layers;
f) a second region in the third dielectric layer defining a signal line trench extending to the first dielectric layer; and
g) a third region in the first dielectric layer and underlying the signal trench, defining a first via hole extending from the signal line trench to the substrate.

14. The device of claim 13 additionally comprising a conductive material positioned in the power line trench, the signal line trench and the first via hole, thereby forming a power line, a signal line and a first via plug.

15. The device of claim 14 wherein the power line comprises a substantially greater thickness than the signal line.

16. The device of claim 13 additionally comprising a fourth region in the first dielectric layer and underlying the power line trench defining a via hole extending from the power line trench to the substrate.

17. The device of claim 16 additionally comprising a conductive material positioned in the power line trench, the signal line trench, the first via hole and the second via hole.

18. A device comprising:
a) a substrate;
b) a first dielectric layer positioned on the substrate;
c) a second dielectric layer positioned on the first dielectric layer;
d) a third dielectric layer positioned on the second dielectric layer, wherein the first, second and third dielectric layers have similar etching characteristics;
e) a first region in the third dielectric layer defining a power line french extending through the third and second dielectric layers;
f) a second region in the third dielectric layer defining a signal line trench extending through the third dielectric layer; and
g) a third region in the second dielectric layer and underlying the signal line trench, defining a first via hole extending from the signal line trench to the substrate.

19. The device of claim 18 additionally comprising a conductive material positioned in the power line trench, the signal line trench and the first via hole, thereby forming a power line, a signal line and a first via plug.

20. The device of claim 19 wherein the power line comprises a substantially greater thickness than the signal line.

21. The device of claim 18 additionally comprising a fourth region in the first dielectric layer and underlying the power line trench, defining a second via hole extending from the power line trench to the substrate.

22. The device of claim 21 additionally comprising a conductive material positioned in the power line trench, the signal line trench, the first via hole and the second via hole.

* * * * *